United States Patent
Kim et al.

(10) Patent No.: US 9,397,231 B2
(45) Date of Patent: Jul. 19, 2016

(54) SEMICONDUCTOR DEVICE HAVING DEPLETION REGION FOR IMPROVING BREAKDOWN VOLTAGE CHARACTERISTICS

(71) Applicant: Samsung Electronics Co., Ltd., Suwon-si (KR)

(72) Inventors: Hyun-Ju Kim, Hwaseong-si (KR); Jae-June Jang, Hwaseong-si (KR); Hoon Chang, Suwon-si (KR); Jae-Ho Kim, Seoul (KR); Kyu-Heon Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/337,811

(22) Filed: Jul. 22, 2014

(65) Prior Publication Data

US 2015/0061067 A1 Mar. 5, 2015

(30) Foreign Application Priority Data

Sep. 3, 2013 (KR) .................. 10-2013-0105513

(51) Int. Cl.
| | |
|---|---|
| *H01L 29/872* | (2006.01) |
| *H01L 29/36* | (2006.01) |
| *H01L 29/66* | (2006.01) |
| *H01L 29/06* | (2006.01) |

(52) U.S. Cl.
CPC .......... *H01L 29/872* (2013.01); *H01L 29/0619* (2013.01); *H01L 29/0623* (2013.01); *H01L 29/36* (2013.01); *H01L 29/66143* (2013.01)

(58) Field of Classification Search
CPC ... H01L 29/36; H01L 29/872; H01L 29/0619; H01L 29/0623; H01L 29/66143
USPC .......................................... 257/375
See application file for complete search history.

(56) References Cited

U.S. PATENT DOCUMENTS

| | | | |
|---|---|---|---|
| 6,765,264 B1 | 7/2004 | Chang et al. | |
| 6,861,723 B2 | 3/2005 | Willmeroth | |
| 7,064,407 B1* | 6/2006 | Mallikarjunaswamy | 257/471 |
| 7,880,166 B2 | 2/2011 | Yu | |
| 8,018,021 B2 | 9/2011 | Kim et al. | |
| 8,330,244 B2 | 12/2012 | Zhang et al. | |
| 8,384,182 B2 | 2/2013 | Mazzola et al. | |
| 8,415,671 B2 | 4/2013 | Zhang | |
| 8,432,012 B2 | 4/2013 | Zhang et al. | |
| 2009/0065888 A1* | 3/2009 | Kato et al. | 257/476 |
| 2009/0166795 A1 | 7/2009 | Yoon | |
| 2011/0156810 A1 | 6/2011 | Girdhar et al. | |
| 2012/0205773 A1 | 8/2012 | Tung et al. | |
| 2012/0228636 A1 | 9/2012 | Maeyama et al. | |
| 2012/0306043 A1 | 12/2012 | Pan et al. | |
| 2013/0009238 A1 | 1/2013 | Bhalla et al. | |

FOREIGN PATENT DOCUMENTS

KR 2010122281 11/2010

* cited by examiner

*Primary Examiner* — Peter Bradford
(74) *Attorney, Agent, or Firm* — Onello & Mello, LLP

(57) ABSTRACT

A semiconductor device having a wide depletion region for increasing the breakdown voltage of the device includes an epitaxial layer of a first conductive type. An anode electrode and a cathode electrode are arranged on the epitaxial layer to be separated from each other. A first drift layer of the first conductive type formed in the epitaxial layer. A Schottky contact area is at a region of contact between the anode electrode and the first drift layer. An impurity region of a second conductive type is different from the first conductive type at the epitaxial layer. An insular impurity region is formed below the Schottky contact area.

15 Claims, 26 Drawing Sheets

1000

1100

1200

SEMICONDUCTOR DEVICE HAVING DEPLETION REGION FOR IMPROVING BREAKDOWN VOLTAGE CHARACTERISTICS

CROSS-REFERENCE TO RELATED APPLICATION

This application claims priority from Korean Patent Application No. 10-2013-0105513 filed on Sep. 3, 2013 in the Korean Intellectual Property Office, and all the benefits accruing therefrom under 35 U.S.C. 119, the contents of which in their entirety are herein incorporated by reference.

BACKGROUND

1. Technical Field

The present inventive concept relates to a semiconductor device and method for fabricating the same.

2. Description of the Related Art

A conventional semiconductor device that is fabricated to include a semiconductor substrate is typically developed to perform a high speed operation at a low voltage. Further, semiconductor device fabricating processes are developed to improve integration density.

Examples of the semiconductor device can include a transistor, a diode and the like. A Schottky diode may be fabricated using a semiconductor substrate can exhibit excellent characteristics at high frequencies and can rely on a rectifying action that occurs at a contact surface between metal and semiconductor.

SUMMARY

Therefore, it is an aspect of the present inventive concept to provide a semiconductor device with improved operating characteristics.

It is another aspect of the present inventive concept to provide a method for fabricating a semiconductor device with improved operating characteristics.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

According to an aspect of the present invention, there is provided a semiconductor device comprising: an epitaxial layer of a first conductive type; an anode electrode and a cathode electrode on the epitaxial layer; a first drift layer of the first conductive type at the epitaxial layer; a Schottky contact area at a region of contact between the anode electrode and the first drift layer; an impurity region of a second conductive type different from the first conductive type at the epitaxial layer; and an insular impurity region formed below the Schottky contact area.

In some embodiments, the insular impurity region includes a region having a maximum cross-sectional diameter that is equal to or less than 5 μm, and having an impurity concentration that is 10 times to 1,000 times an impurity concentration of the epitaxial layer.

In some embodiments, the semiconductor device comprises a Schottky diode.

In some embodiments, a conductive type of the insular impurity region is the same as the first conductive type.

In some embodiments, the first drift layer comprises a plurality of insular impurity regions separated from each other, and one of the plurality of insular impurity regions includes the insular impurity region below the Schottky contact area.

In some embodiments, the impurity region of the second conductive type comprises wells of the second conductive type arranged on both sides of the insular impurity region.

In some embodiments, the anode electrode and the cathode electrode are arranged in a grid shape.

In some embodiments, the cathode electrode comprises first and second cathode electrodes, the first cathode electrode has a dot shape, the anode electrode is constructed and arranged to surround the first cathode electrode, and the second cathode electrode is constructed and arranged to surround the anode electrode.

In some embodiments, a conductive type of the insular impurity region is the same as the second conductive type.

In some embodiments, the first drift layer is constructed and arranged to surround the insular impurity region.

In some embodiments, the impurity region of the second conductive type comprises a second drift layer of the second conductive type at the first drift layer.

In some embodiments, the second drift layer and the insular impurity region are constructed and arranged to be separated from each other.

In some embodiments, an impurity concentration of the insular impurity region is higher than an impurity concentration of the second drift layer.

In some embodiments, the impurity region of the second conductive type comprises a plurality of second drift layers of the second conductive type at the first drift layer, and wherein the insular impurity region is one of the plurality of second drift layers.

In some embodiments, the first conductive type includes an N type conductivity type and the second conductive type includes a P type conductivity type.

In some embodiments, the semiconductor device, further comprises a semiconductor substrate of the second conductive type; and a buried layer of the first conductive type formed on the semiconductor substrate, wherein the epitaxial layer is formed on the buried layer.

According to another aspect of the present invention, there is provided a semiconductor device comprising: an epitaxial layer of a first conductive type; a plurality of insular impurity regions having the first conductive type at the epitaxial layer, and separated from each other; first wells formed in the epitaxial layer, the first wells separated from each other and having a second conductive type that is different from the first conductive type; first and second electrodes on the epitaxial layer, the first and second electrodes separated from each other by an element isolation film; and second wells in the plurality of insular impurity regions and in contact with the first electrode, wherein at least one of the plurality of insular impurity regions is below the second electrode.

In some embodiments, the second wells have a conductive type that is the same as the first conductive type.

In some embodiments, a Schottky barrier is at a contact surface between the second electrode and one of the plurality of insular impurity regions.

In some embodiments, an impurity concentration of the plurality of insular impurity regions is higher than an impurity concentration of the epitaxial layer.

According to still another aspect of the present invention, there is provided a semiconductor device comprising: an epitaxial layer of a first conductive type; a first drift layer of the first conductive type on the epitaxial layer; first and second electrodes on the first drift layer, the first and second electrodes separated from each other by an element isolation film;

second drift layers in the first drift layer and separated from each other, the second drift layers having a second conductive type different from the first conductive type; a plurality of wells formed in the first drift layer, the wells in contact with the first electrode; and a body region of the second conductive type at the first drift layer below the second electrode, wherein the body region is an insular impurity region that is separated from the second electrode by the first drift layer.

In some embodiments, the first electrode comprises a cathode electrode, and the second electrode comprises an anode electrode.

In some embodiments, an impurity concentration of the body region is 10 times to 1,000 times an impurity concentration of the first drift layer.

In some embodiments, a depth of lower surfaces of the second drift layers is larger than a depth of a lower surface of the body region.

According to another aspect of the present invention, there is provided a semiconductor device comprising: a rectifier that converts first and second outputs provided from a resonator into a third output, wherein the rectifier comprises: at least one Schottky diode that provides at least one of the first and second outputs to an anode electrode; and an insular impurity region below the anode electrode of the Schottky diode.

According to another aspect of the present invention, there is provided a semiconductor device comprising: an epitaxial layer; an anode electrode on the epitaxial layer; and an insular impurity region at a region of the epitaxial layer below the anode electrode to provide a distance between the anode electrode and an electric field formed during operation of the device field.

In some embodiments, the semiconductor device further comprises a Schottky contact area at a region of contact between the anode electrode and the first drift layer, wherein the insular impurity region formed below the Schottky contact area.

In some embodiments, the insular impurity region includes a region having a maximum cross-sectional diameter that is equal to or less than 5 μm, and having an impurity concentration that is 10 times to 1,000 times an impurity concentration of the epitaxial layer.

In some embodiments, the semiconductor device further comprises at least one drift layer, the insular impurity region below the anode electrode corresponding to a draft layer of the at least one drift layer.

In some embodiments, the semiconductor device further comprises an impurity region comprises wells of the different conductive type than that of the epitaxial layer, the wells arranged on both sides of the insular impurity region.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
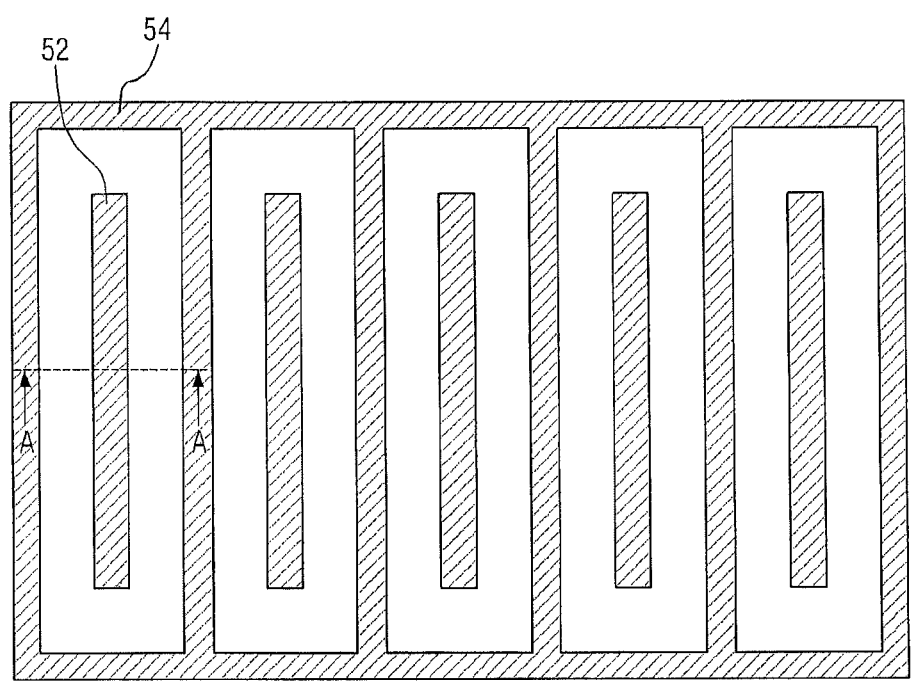
FIG. 1 is a plan view of a semiconductor device according to an embodiment of the present inventive concept.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a semiconductor device according to an embodiment of the present inventive concept will be described with reference to FIGS. 1 and 2.

FIG. 1 is a plan view of a semiconductor device according to an embodiment of the present inventive concept. FIG. 2 is a cross-sectional view taken along line A-A of FIG. 1. An example of a semiconductor device according to embodiments of the present inventive concept can include a Schottky diode, described herein. However, the present inventive concept is not limited thereto.

Figure 2:
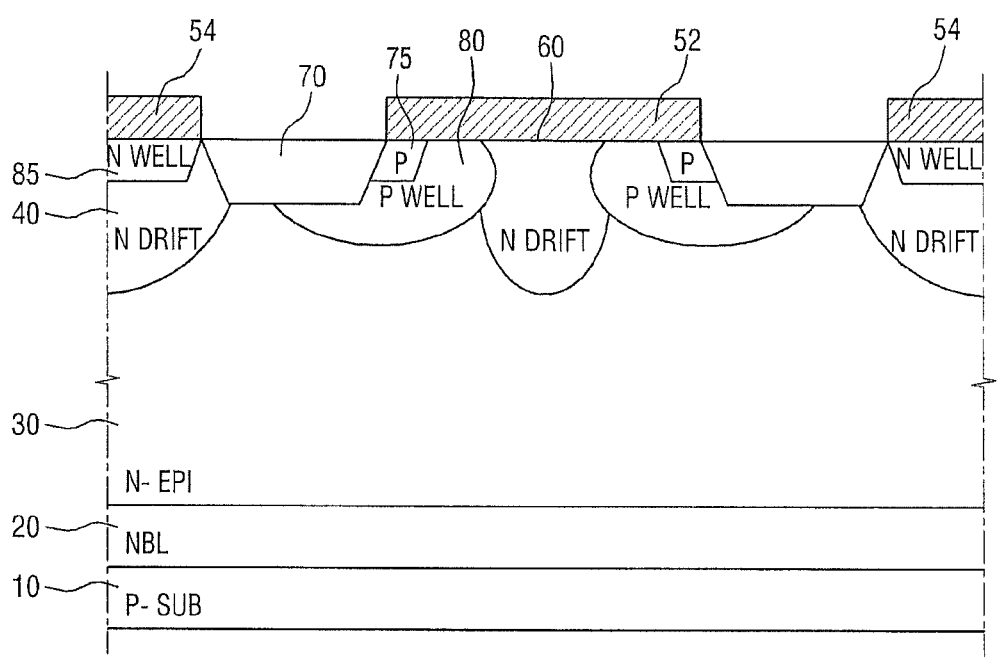
FIG. 2 is a cross-sectional view taken along line A-A of FIG. 1.

Referring to FIGS. 1 and 2, a semiconductor device 1 includes a substrate 10, a buried layer 20, an epitaxial layer 30, first drift layers 40, a plurality of first wells 80, a plurality of second wells 85, a plurality of third wells 75, an anode electrode 52, and a cathode electrode 54.

The substrate 10 may include a semiconductor material. The substrate 10 may be made of at least one semiconductor material selected from the group consisting of, for example, Si, Ge, SiGe, GaP, GaAs, SiC, SiGeC, InAs and InP.

In some embodiments of the present inventive concept, an insulating substrate may be used as the substrate 10. Specifically, a silicon-on-insulator (SOI) substrate may be used as the substrate 10. In embodiments that include an SOI substrate, there is an advantage of reducing delay time in an operation process of the semiconductor device 1.

In this embodiment, a conductive type of the substrate 10 may be, for example, a P type. A concentration of impurities in the substrate 10 may be lower than a concentration of impurities in the first wells 80.

The buried layer 20 may be formed on the substrate 10. In this embodiment, a conductive type of the buried layer 20 may be, for example, an N type.

In some embodiments of the present inventive concept, the buried layer 20 may be formed inside the substrate 10 and/or over the substrate 10. That is, the buried layer 20 may be formed at a boundary between the substrate 10 and the epitaxial layer 30. In order that a portion of the buried layer 20 be formed on the substrate 10 and the remaining portion of the buried layer 20 be formed on the epitaxial layer 30, after the buried layer 20 is formed in the substrate 10 and the epitaxial layer 30 is formed on the substrate 10, a heat treatment may be performed. When the heat treatment is in progress, since the buried layer 20 is diffused into the substrate 10 and the epitaxial layer 30, a portion of the buried layer 20 may be formed on the substrate 10 and the remaining portion of the buried layer 20 may be formed on the epitaxial layer 30.

In other embodiments of the present inventive concept, the buried layer 20 may be omitted.

The epitaxial layer 30 may be formed on the buried layer 20. In this embodiment, a conductive type of the epitaxial layer 30 may be, for example, an N type. Further, in this case, a concentration of impurities in the epitaxial layer 30 may be lower than a concentration of impurities in the buried layer 20 and the first drift layers 40.

The first drift layers 40, the first wells 80, the second wells 85 and the like may be formed in the epitaxial layer 30.

In this embodiment, as illustrated, the first drift layers 40 may include a plurality of insular impurity regions that are separated from each other. As used herein, an insular impurity region refers to a region having a maximum cross-sectional diameter that can be equal to or less than 5 µm, and an impurity concentration that can be 10 times to 1,000 times the impurity concentration of the epitaxial layer 30. In the present embodiment, by forming the first drift layers 40 as a plurality of insular impurity regions separated from each other as described above, it is possible to improve operating characteristics of the semiconductor device 1. A detailed description thereof will be described later.

In this embodiment, the first drift layers 40 may have a conductive type, for example, an N type. Specifically, the concentration of impurities \in the first drift layers 40 may be, for example, 1e15 to 1e18 atoms/cm$^2$. However, the present inventive concept is not limited thereto.

A conductive type of the first wells 80 formed in the epitaxial layer 30 may be, for example, a P type. Accordingly, the first wells 80 and the epitaxial layer 30 may form a PN junction. The concentration of impurities contained in the first wells 80 may be higher than the concentration of impurities contained in the substrate 10.

As illustrated, the first wells 80 may be arranged to be separated from each other by the first drift layers 40 arranged below the anode electrode 52. In this case, the first wells 80 may be arranged to overlap the first drift layers 40 as illustrated. The first wells 80 may be arranged to overlap an element isolation film 70 as illustrated.

In the present embodiment, the first wells 80 may be formed to have a thickness that is less than a thickness of the first drift layers 40. Specifically, the depth of the lower surfaces of the first wells 80 may be less than the depth of the lower surfaces of the first drift layers 40.

The second wells 85 may be arranged in the first drift layers 40. Specifically, the second wells 85 may be arranged in the first drift layers 40 positioned below the cathode electrode 54. The second wells 85 may be in contact with the cathode electrode 54. Accordingly, the second wells 85 may be electrically connected to the cathode electrode 54.

A conductive type of the second wells 85 may be, for example, an N type. As illustrated, the second wells 85 may be arranged so as not to overlap the element isolation film 70. The first drift layers 40 arranged below the cathode electrode 54 may be arranged to overlap the element isolation film 70 as illustrated.

The third wells 75 may be arranged in the first wells 80. Specifically, the third wells 75 may be arranged in the first wells 80 below the anode electrode 52. The third wells 75 may be in contact with the anode electrode 52. Accordingly, the third wells 75 may be electrically connected to the anode electrode 52. A conductive type of the third wells 75 may be, for example, a P type.

The anode electrode 52 and the cathode electrode 54 may be formed on the epitaxial layer 30. The anode electrode 52 and the cathode electrode 54 may be separated from each other by the element isolation film 70 as illustrated.

In this embodiment, the element isolation film 70 may be formed by, for example, Shallow Trench Isolation (STI), but the present inventive concept is not limited thereto.

In this embodiment, the cathode electrode 54 may be arranged to surround the anode electrode 52. Further, the anode electrode 52 may be formed to extend in one direction (e.g., vertical direction of FIG. 1).

A Schottky contact area 60 may be defined in a region where the anode electrode 52 is in contact with the first drift layers 40. A Schottky barrier may be formed in a contact surface between the first drift layers 40 and the anode electrode 52 of the Schottky contact area 60. The semiconductor device 1 according to the present embodiment may be activated, turned on, or the like even at a low voltage by using this Schottky barrier.

The operating characteristics of the semiconductor device 1 may be affected by resistance characteristics and breakdown voltage (BV) characteristics.

Specifically, the resistance of the semiconductor device 1 should preferably be low for a high-speed operation of the semiconductor device 1. Further, in order to decrease the resistance of the semiconductor device 1, the carrier mobility can be increased by increasing a concentration of impurities in the semiconductor device 1.

In order that the semiconductor device 1 operates reliably even at a high voltage, the breakdown voltage of the semiconductor device 1 should be high. Further, in order to increase the breakdown voltage of the semiconductor device 1, a wide depletion region in the semiconductor device 1 can be formed.

In the semiconductor device 1 according to the present embodiment, by forming the depletion region widely while maintaining the concentration of impurities in the semiconductor device 1 to be high as necessary, it is possible to improve the operating characteristics of the semiconductor device 1. Hereinafter, the effects of the semiconductor device according to the embodiment of the present inventive concept will be described with reference to FIGS. 3 to 5.

Figure 3:
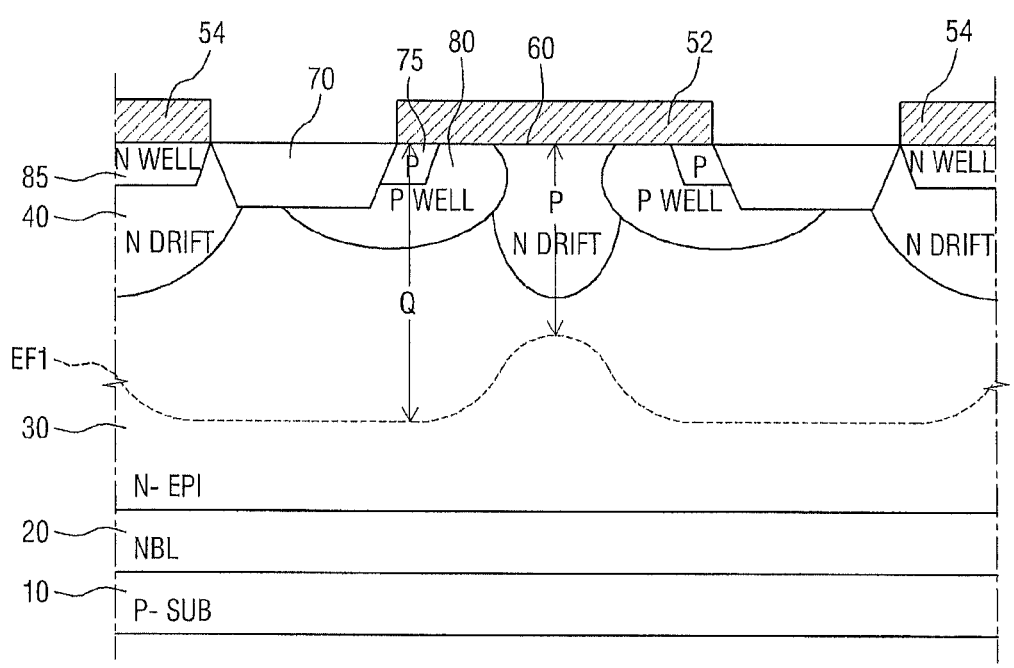
FIGS. 3 to 5 are diagrams illustrating the effects of the semiconductor device according to the embodiment of the present inventive concept.
Figure 4:
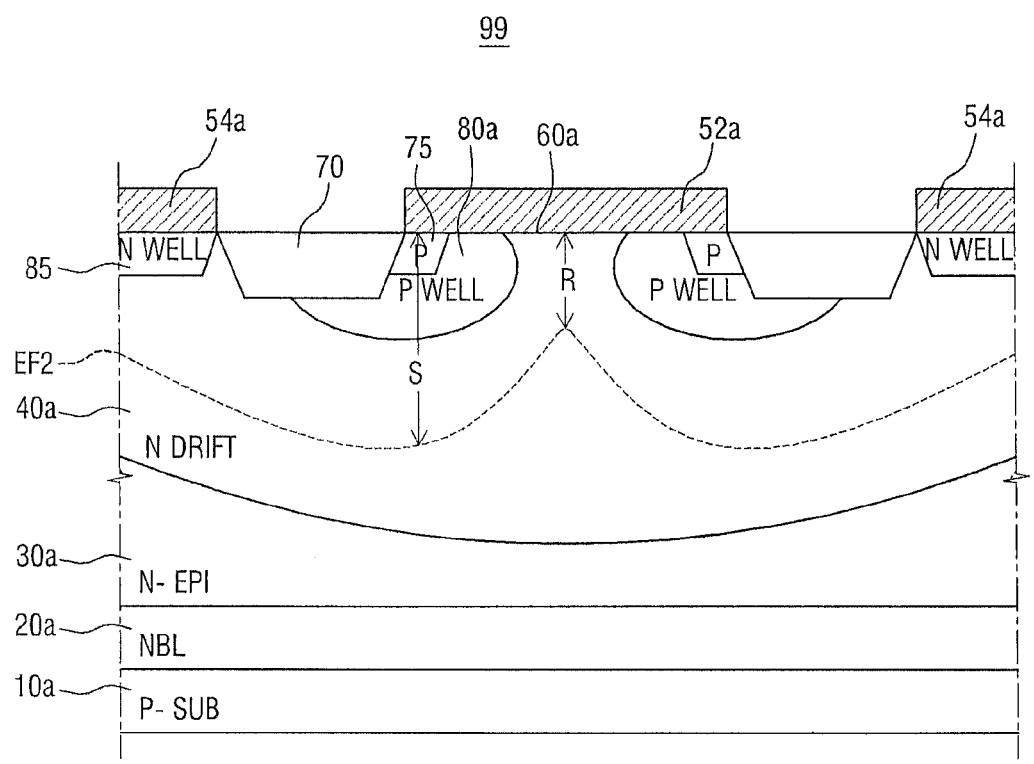

FIG. 3 is a diagram illustrating an electric field EF1 formed in the semiconductor device 1 according to the embodiment of the present inventive concept. FIG. 4 is a diagram illustrating an electric field EF2 formed in a semiconductor device 99. Accordingly, FIGS. 3 and 4 are illustrated to draw comparisons between a conventional semiconductor device and a semiconductor device in accordance with an embodiment of the inventive concept.

In the semiconductor device 1 of FIG. 3 according to the present embodiment, due to an insular impurity region (corresponding to one of the first drift layers 40 in the present embodiment) formed below the anode electrode 52, the electric field EF1 is formed away from the anode electrode 52. However, in the exemplary semiconductor device 99 of FIG. 4 that is not in accordance with the embodiment of the present inventive concept, since an insular impurity region is not formed below an anode electrode 52a, the electric field EF2 is formed adjacent to the anode electrode 52.

Specifically, in FIG. 3, a first depth P is about 2 μm, and a second depth Q is about 3.15 μm. However, in FIG. 4, a third depth R is about 1 μm, and a fourth depth S is about 2.5 μm. In other words, the depletion region of the semiconductor device 1 of FIG. 3 according to the present embodiment is formed to be wider than the depletion region of the exemplary semiconductor device 99 of FIG. 4, which is not in accordance with the embodiment of the present inventive concept. Accordingly, the breakdown voltage characteristics of the semiconductor device 1 may be improved.

Figure 5:
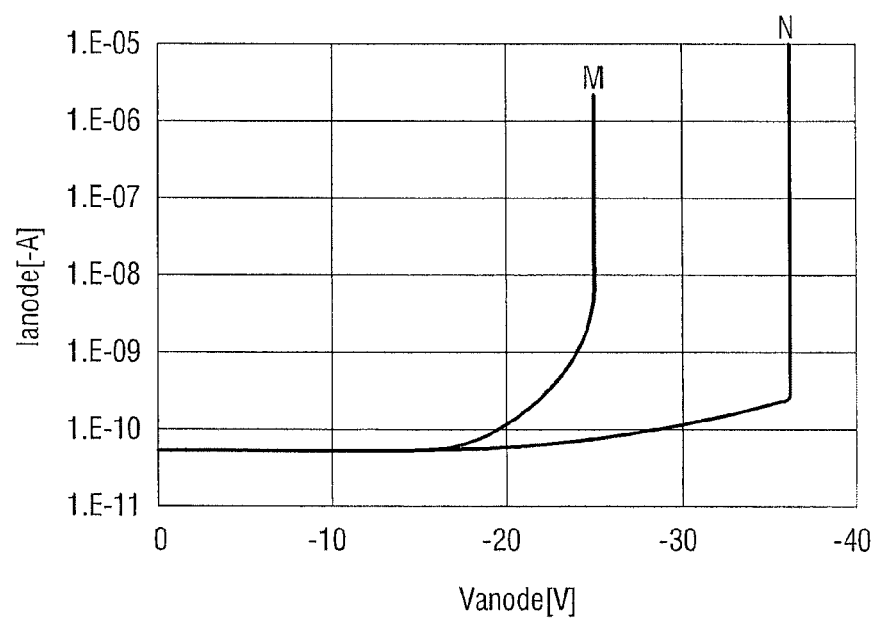

FIG. 5 is a graph showing the breakdown voltage characteristics of the semiconductor device 1 of FIG. 4 and the semiconductor device 99 of FIG. 5.

In FIG. 5, A graph M is obtained by measuring the current flowing through the anode electrode 52a while applying different voltages to the anode electrode 52a of the exemplary semiconductor device 99 that is not in accordance with the present embodiment. A graph N is obtained by measuring the current flowing through the anode electrode 52 while applying different voltages to the anode electrode 52 of the semiconductor device 1 according to the present embodiment.

At FIG. 5, it can be seen that a maximum breakdown voltage of graph M is about −25 V, while a maximum breakdown voltage of graph N is about −37 V. In other words, it can be seen that the breakdown voltage is improved in the semiconductor device 1 according to the present embodiment.

Next, a semiconductor device according to another embodiment of the present inventive concept will be described with reference to FIGS. 6 and 7.

Figure 6:
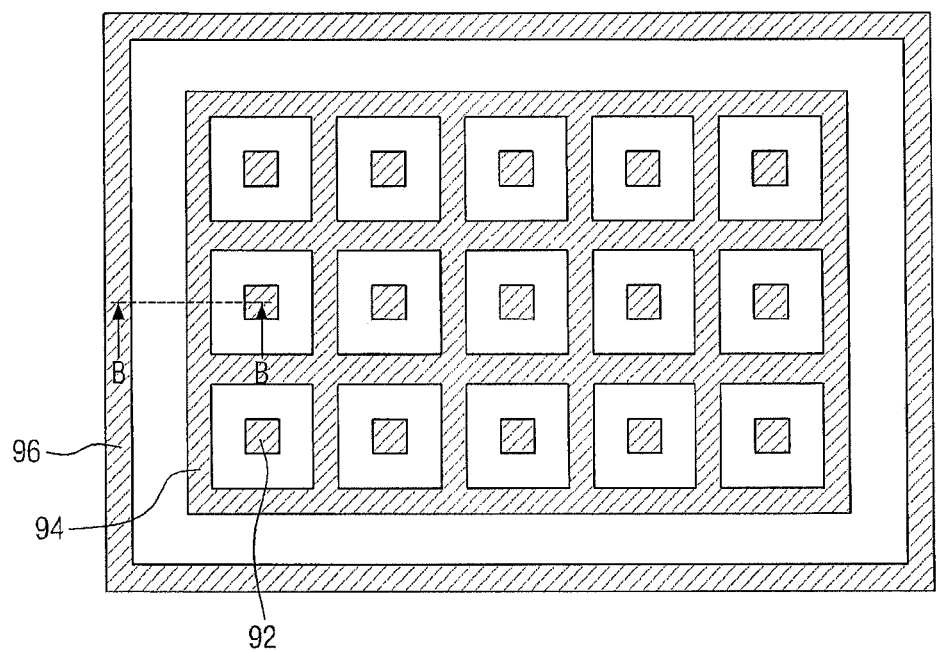
FIG. 6 is a plan view of a semiconductor device according to another embodiment of the present inventive concept.

FIG. 6 is a plan view of a semiconductor device according to another embodiment of the present inventive concept. FIG. 7 is a cross-sectional view taken along line B-B of FIG. 6. Hereinafter, a repeated description will be omitted in order to avoid redundancy, and a description will be given focusing on differences from the above-described embodiment.

Figure 7:
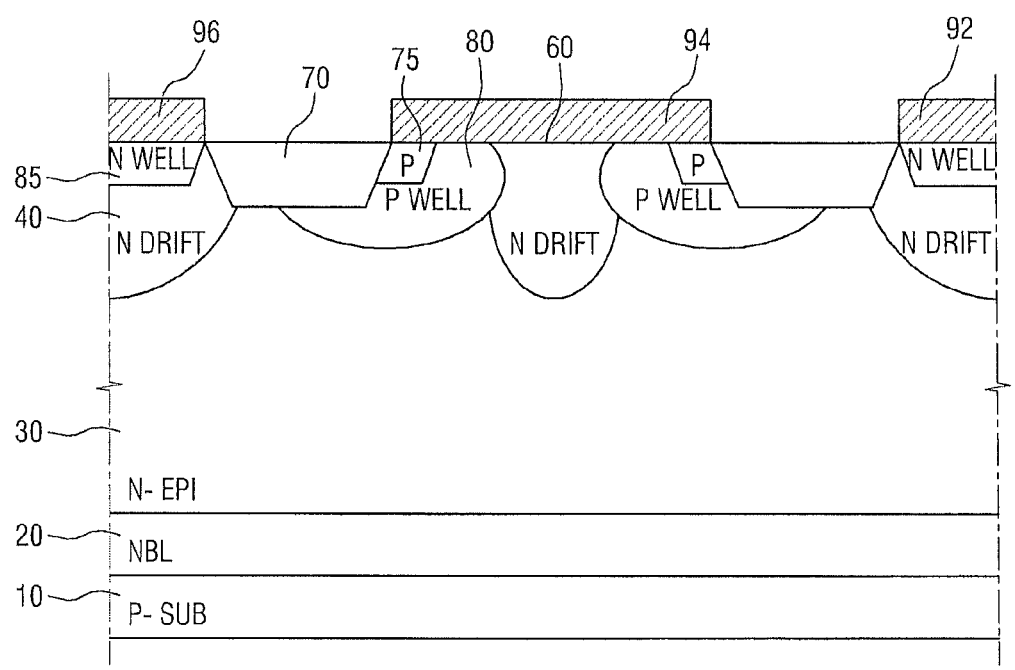
FIG. 7 is a cross-sectional view taken along line B-B of FIG. 6.

Referring to FIGS. 6 and 7, in a semiconductor device 2 according to the present embodiment, the shapes or other configuration-related features of an anode electrode 94 and a cathode electrode 92 and 96 may be different from those of the above-described embodiment.

Specifically, in the semiconductor device 2 according to the present embodiment, the anode electrode 94 and the cathode electrode 92 and 96 may be arranged in a grid shape.

In the semiconductor device 2 according to the present embodiment, a first cathode electrode 92 and a second cathode electrode 96 may be provided. Further, as shown in FIG. 6, the first cathode electrode 92 may be arranged in the form of dots. The anode electrode 94 may be arranged to surround the first cathode electrode 92 arranged in the form of dots. The second cathode electrode 96 may be arranged to surround the anode electrode 94.

In this embodiment, by arranging the anode electrode 94 and the cathode electrode 92 and 96 as described above, the resistance characteristics of the semiconductor device 2 can be improved. As a result, the operating characteristics of the semiconductor device 2 can be improved.

Next, a semiconductor device according to another embodiment of the present inventive concept will be described with reference to FIGS. 8 and 9.

Figure 8:
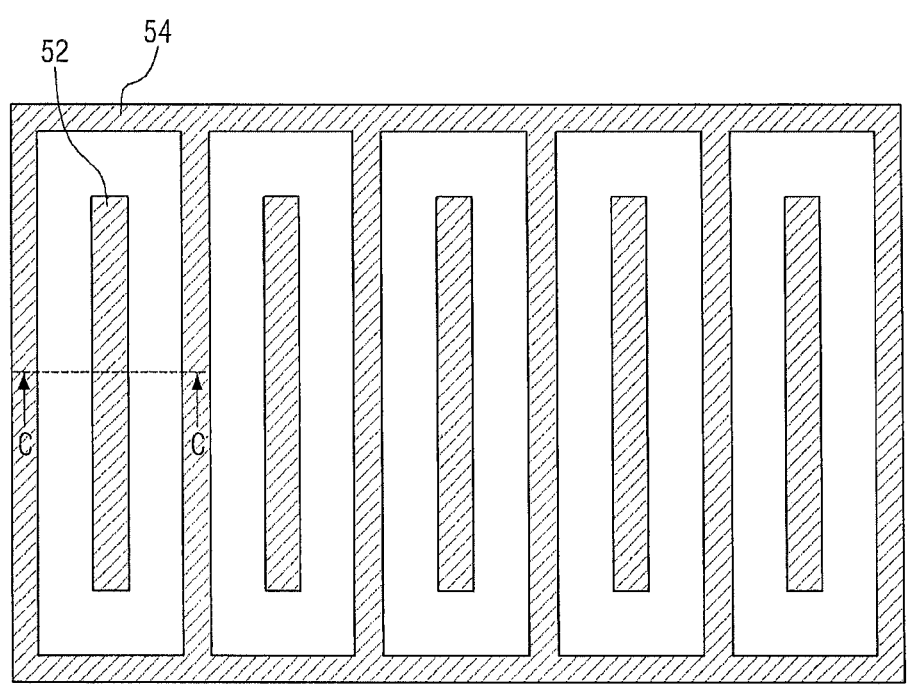
FIG. 8 is a plan view of a semiconductor device according to still another embodiment of the present inventive concept.

FIG. 8 is a plan view of a semiconductor device according to still another embodiment of the present inventive concept. FIG. 9 is a cross-sectional view taken along line C-C of FIG. 8.

Figure 9:
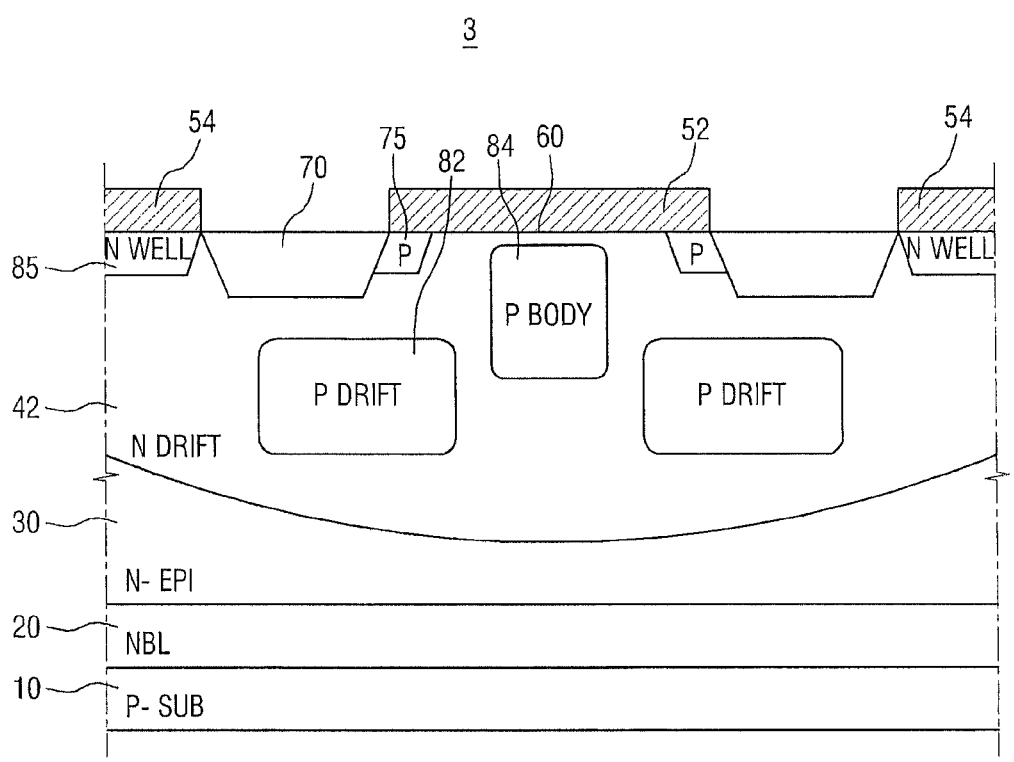
FIG. 9 is a cross-sectional view taken along line C-C of FIG. 8.

Referring to FIGS. 8 and 9, a semiconductor device 3 includes a substrate 10, a buried layer 20, an epitaxial layer 30, a first drift layer 42, second drift layers 82, a body region 84, second wells 85, third wells 75, an anode electrode 52, and a cathode electrode 54.

The substrate 10 may include a semiconductor material. The substrate 10 may be made of at least one semiconductor material selected from the group consisting of, for example, Si, Ge, SiGe, GaP, GaAs, SiC, SiGeC, InAs and InP.

In some embodiments of the present inventive concept, an insulating substrate may be used as the substrate 10. Specifically, a silicon-on-insulator (SOI) substrate may be used as the substrate 10. In the case of using the SOI substrate, there is an advantage of reducing delay time in an operation process of the semiconductor device 3.

In this embodiment, a conductive type of the substrate 10 may be, for example, a P type. Further, in this case, a concentration of impurities in the substrate 10 may be lower than a concentration of impurities in the second drift layers 82 and the body region 84.

The buried layer 20 may be formed on the substrate 10. In this embodiment, a conductive type of the buried layer 20 may be, for example, an N type.

The epitaxial layer 30 may be formed on the buried layer 20. In this embodiment, a conductive type of the epitaxial layer 30 may be, for example, an N type. Further, in this case, a concentration of impurities in the epitaxial layer 30 may be lower than a concentration of impurities in the buried layer 20 and the first drift layer 42.

The first drift layer 42, the second drift layers 82, the body region 84, and/or the second wells 85 and the like may be formed in the epitaxial layer 30.

In the semiconductor device 3 according to the present embodiment, the first drift layer 42 may be formed on the entire surface of the epitaxial layer 30. Specifically, the first drift layers 40 of FIG. 2 can be formed as a plurality of insular impurity regions separated from each other in the above-described embodiments. However, the first drift layer 42 may be formed on the entire surface of the epitaxial layer 30 in the present embodiment. Accordingly, in this embodiment, the second drift layers 82, the body region 84, the second wells 85 and the like may be formed in the first drift layer 42.

In this embodiment, a conductive type of the first drift layer 42 may be, for example, an N type. Specifically, the concentration of impurities contained in the first drift layer 42 may be, for example, 1e15 to 1e18 atoms/cm$^2$, but the present inventive concept is not limited thereto.

The second wells 85 may be arranged in the first drift layer 42. Specifically, the second wells 85 may be arranged in the first drift layer 42 arranged below the cathode electrode 54. The second wells 85 may be in contact with the cathode electrode 54. Accordingly, the second wells 85 may be electrically connected to the cathode electrode 54.

A conductive type of the second wells 85 may be, for example, an N type. As illustrated herein, the second wells 85 may be arranged so as not to overlap the element isolation film 70.

A conductive type of the second drift layers 82 formed in the first drift layer 42 may be, for example, a P type. Further, as illustrated, the first drift layer 42 may be arranged to surround the second drift layers 82. Accordingly, the second drift layers 82 and the first drift layer 42 may form a PN junction.

A concentration of impurities in the second drift layers 82 may be higher than a concentration of impurities in the substrate 10. Specifically, the concentration of impurities in the second drift layers 82 may be, for example, 1e14 to 1e18 atoms/cm$^2$, but the present inventive concept is not limited thereto.

As illustrated, the second drift layers 82 may be separated from each other by the body region 84. In this case, the second drift layers 82 may be formed to be deeper than the body region 84. Specifically, the depth of the lower surfaces of the second drift layers 82 may be larger than the depth of the lower surface of the body region 84.

As illustrated, the second drift layers 82 may be arranged to also overlap the element isolation film 70. Further, the second drift layers 82 may be arranged so as not to overlap the body region 84. In other words, the second drift layers 82 and the body region 84 may be separated from each other.

The body region 84 may be formed below the anode electrode 52. In this embodiment, the body region 84 may be formed in the form of an insular impurity region.

A conductive type of the body region 84 may be, for example, a P type. Further, a concentration of P-type impurities in the body region 84 may be higher than a concentration of P-type impurities in the second drift layers 82. Specifically, the concentration of P-type impurities in the body region 84 may be, for example, 1e16 to 1e20 atoms/cm$^2$, but the present inventive concept is not limited thereto.

The first drift layer 42 may surround the body region 84 as illustrated. Accordingly, a Schottky barrier may be formed in the Schottky contact area 60 defined when the first drift layer 42 is in contact with the anode electrode 52. Thus, the semiconductor device 3 according to the present embodiment may be turned on even at a low voltage by using the Schottky barrier.

The third wells 75 may be disposed in the first drift layer 42. Specifically, the third wells 75 may be arranged in the first drift layer 42 arranged below the anode electrode 52. The third wells 75 may be abut or be otherwise in contact with the anode electrode 52. Accordingly, the third wells 75 may be electrically connected to the anode electrode 52. A conductive type of the third wells 75 may be, for example, a P type.

The anode electrode 52 and the cathode electrode 54 may be formed on the first drift layer 42. The anode electrode 52 and the cathode electrode 54 may be separated from each other by the element isolation film 70 as illustrated.

In this embodiment, the cathode electrode 54 may be constructed and arranged to surround the anode electrode 52. Further, the anode electrode 52 may be formed to extend in one direction, for example, a vertical direction as shown in FIG. 8).

Although not shown in detail, in some embodiments of the present inventive concept, the shapes of a cathode electrode and the anode electrode may be arranged in a grid shape, for example, as shown in FIG. 6. In this case, the resistance characteristics of the semiconductor device 3 can be further improved.

Figure 10:
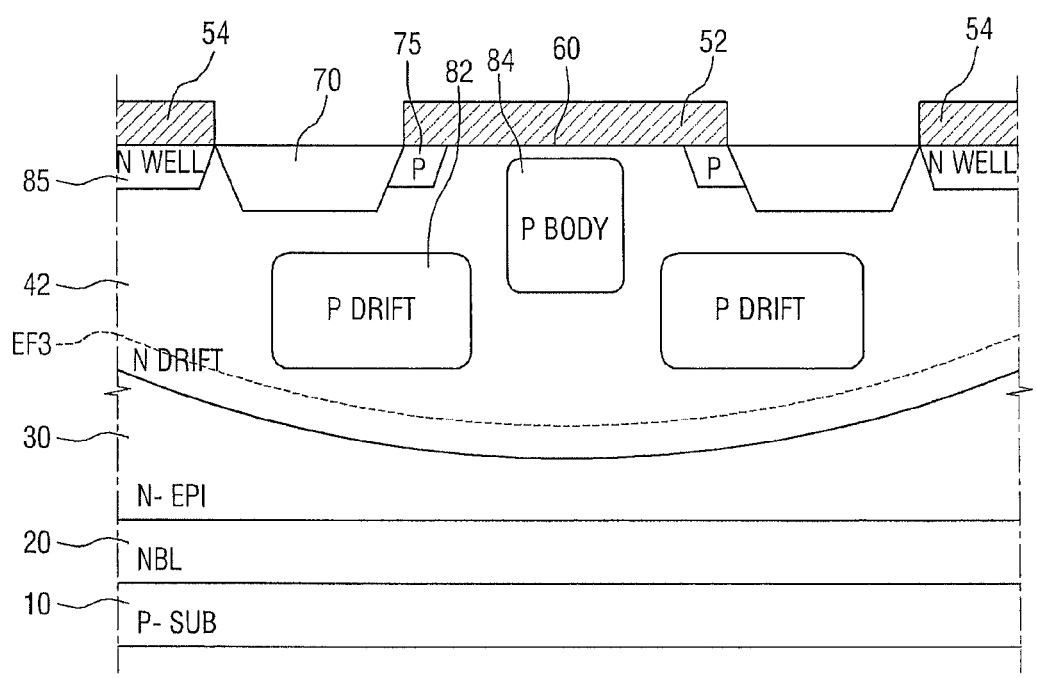
FIGS. 10 and 11 are diagrams illustrating the effects of the semiconductor device according to another embodiment of the present inventive concept.
Figure 11:
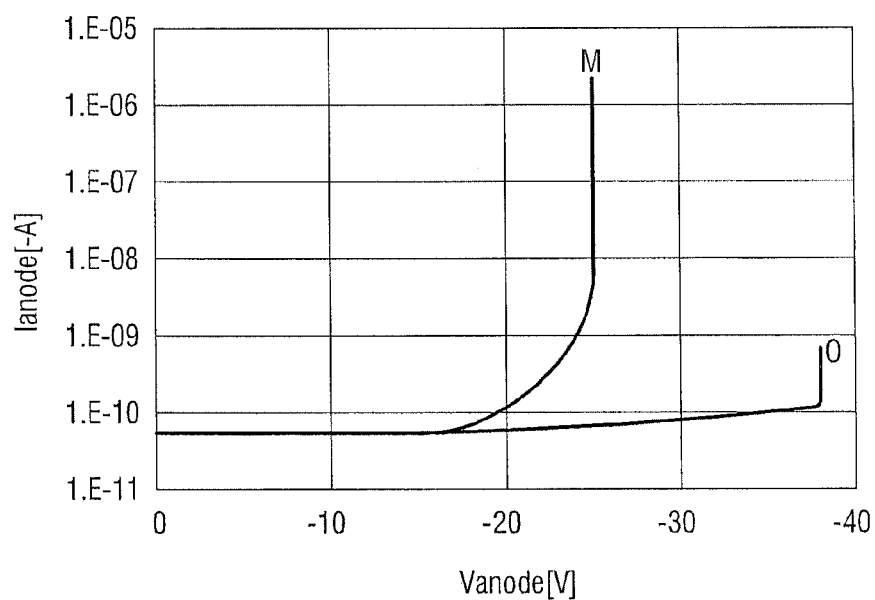

FIGS. 10 to 11 are diagrams for explaining the effects of a semiconductor device 3 according to another embodiment of the present inventive concept.

In particular, FIG. 10 is a diagram illustrating an electric field EF3 formed in the semiconductor device 3 according to the present embodiment. Due to an insular impurity region, for example, corresponding to the body region 84 in the present embodiment, formed below the anode electrode 52, the electric field EF3 can be formed at a distance or away from the anode electrode 52. That is, the depletion region in the semiconductor device 3 according to the present embodiment is wider than the depletion region in a semiconductor device 99, see, for example, FIG. 4, which is not in accordance with the embodiment of the present inventive concept. Accordingly, the breakdown voltage characteristics of the semiconductor device 3 can be improved.

Further, in the case of the semiconductor device 3 according to the present embodiment, the first drift layer 42 may be formed on the entire surface of the epitaxial layer 30. Thus, since a concentration of impurities in the semiconductor device 3 becomes higher than those of the above-described embodiments, the resistance characteristics of the semiconductor device 3 can be improved.

FIG. 11 is a graph showing the breakdown voltage characteristics of a semiconductor device according to the present embodiment as distinguished from a conventional semiconductor device, i.e., a device that is not in accordance with the present embodiment. In describing the graph of FIG. 11, reference can be made to the semiconductor device 3 referred to in embodiments herein and the semiconductor device 99 referred to herein.

Specifically, in FIG. 11, M refers to a graph obtained by measuring a current flowing through the anode electrode 52a while applying different voltages to the anode electrode 52a of the exemplary semiconductor device 99 (see FIG. 4) which is not in accordance with the present embodiment. O refers to a graph obtained by measuring a current flowing through the anode electrode 52 while applying different voltages to the anode electrode 52 of the semiconductor device 3 according to the present embodiment.

Referring to FIG. 11, it can be seen that a maximum breakdown voltage of graph M is about −25 V, while a maximum breakdown voltage of graph O is about −38 V. In other words, it can be seen that the breakdown voltage is improved in the semiconductor device 3 according to the present embodiment.

Figure 12:
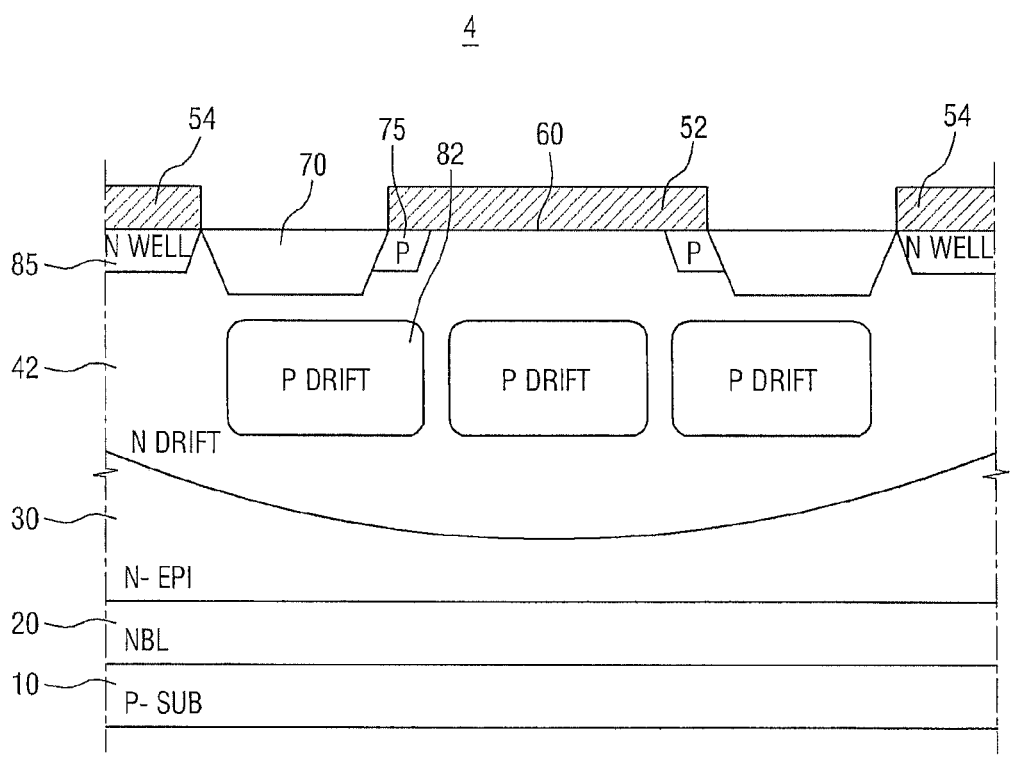
FIG. 12 is a cross-sectional view of a semiconductor device according to still another embodiment of the present inventive concept.

FIG. 12 is a cross-sectional view of a semiconductor device according to another embodiment of the present inventive concept. Hereinafter, a repeated description will be omitted to avoid redundancy, and a description will be given focusing on differences from the above-described embodiment.

Referring to FIG. 12, in a semiconductor device 4 according to the present embodiment, the body region 84 described with reference to FIG. 9. is replaced by a second drift layers 82. In other words, in the semiconductor device 4 according to the present embodiment, the second drift layers 82 are formed as a plurality of insular impurity regions separated from each other, and one of the insular impurity regions may be formed below the Schottky contact area 60 as illustrated.

In this case, the depletion region in the semiconductor device 4 may be formed widely by the second drift layers 82 disposed below the Schottky contact area 60. Accordingly, the breakdown voltage characteristics of the semiconductor device 4 can be improved.

Figure 13:
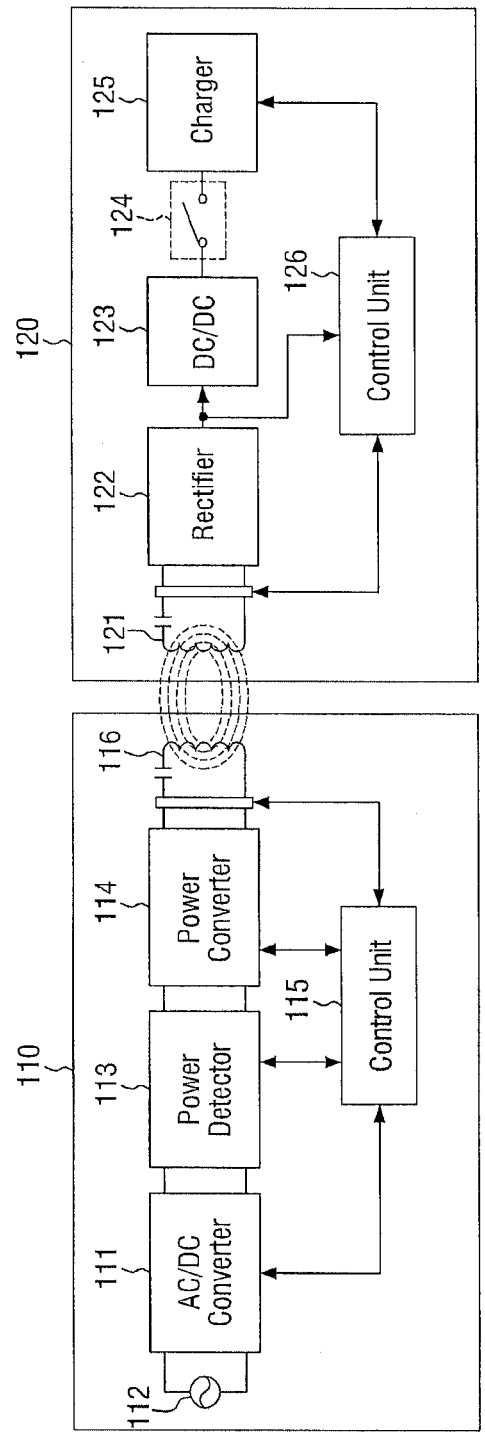
FIG. 13 is a block diagram of a semiconductor system according to an embodiment of the present inventive concept.
Figure 14:
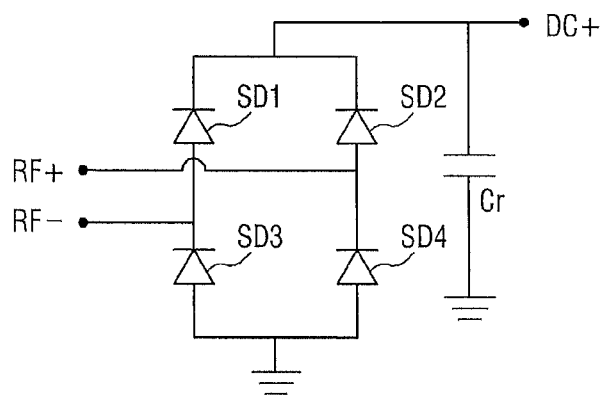
FIG. 14 is an exemplary circuit diagram of a rectifier shown in FIG. 13.

FIG. 13 is a block diagram of a semiconductor system according to an embodiment of the present inventive concept. FIG. 14 is an exemplary circuit diagram of a rectifier shown in FIG. 13. The following description will be given in conjunction with a wireless power transmission system as an example of a semiconductor system according to an embodiment of the present inventive concept, but the present inventive concept is not limited thereto.

Referring to FIG. 13, the semiconductor system according to the present embodiment includes a source device 110 and a target device 120.

The source device 110 may include an AC/DC converter 111, a power detector 113, a power converter 114, a control unit 115 and a source resonator 116.

The target device 120 may include a target resonator 121, a rectifier 122, a DC/DC converter 123, a switch unit 124, a charger 125 and a control unit 126.

The AC/DC converter 111 may produce a DC voltage by rectifying an AC voltage having a bandwidth of several tens of Hz, which is output from a power supply 112. The AC/DC converter 111 may output a certain level of DC voltage, or adjust an output level of the DC voltage under control of the control unit 115.

The power detector 113 may detect a current and voltage output from the AC/DC converter 111, and transmit information about the detected current and voltage to the control unit 115. Further, the power detector 113 may detect a current and voltage input to the power converter 114.

The power converter 114 may convert a DC voltage into an AC voltage in response to a switching pulse signal having a bandwidth ranging from several MHz to several tens of MHz to generate power. That is, the power converter 114 may convert a DC voltage into an AC voltage using a resonant frequency to generate "communication power" or "charging power" that is used in the target device 120.

In this case, "communication power" may refer to energy for activating a communication module and a processor of the target device 120. As a meaning of energy for activating, "communication power" may also be referred to as wake-up power.

The communication power may be transmitted for a predetermined period of time in the form of constant waves (CW). The "charging power" may refer to energy for charging a battery connected to the target device 120 or included in the target device 120. The charging power may be transmitted continuously for a predetermined period of time, and may be transmitted at a power level higher than that of the "communication power." For example, the power level of the communication power may be 0.1~1 Watt, and the power level of the charging power may be 1~20 Watt.

The control unit 115 may control a frequency of a switching pulse signal. The frequency of the switching pulse signal may be determined by the control unit 115. The control unit 115 may generate a modulation signal for transmission to the target device 120 by controlling the power converter 114. That is, the control unit 115 may transmit various messages to the target device 120 through an in-band communication. Further, the control unit 115 may detect a reflected wave and demodulate a signal received from the target device 120 through an envelope of the reflected wave.

The control unit 115 may generate a modulation signal for performing in-band communication by various methods. The control unit 115 may generate a modulation signal by turning on/off a switching pulse signal. Further, the control unit 115 may generate a modulation signal by performing a delta-sigma modulation. The control unit 115 may generate a pulse width modulation signal having a constant envelope.

The control unit 115 may perform an out-of-band communication using a separate communication channel rather than the resonant frequency. The control unit 115 may include a communication module such as Zigbee™ and/or Bluetooth™ technology. The control unit 115 may transmit/receive data to/from the target device 120 through an out-of-band communication.

The source resonator 116 may transfer electromagnetic energy to the target resonator 121. That is, the source resonator 116 may transfer communication power or charging power to the target device 120 through magnetic coupling with the target resonator 121.

The target resonator 121 may receive the electromagnetic energy from the source resonator 116. That is, the target resonator 121 may receive the communication power or charging power from the source device 110 through magnetic coupling with the source resonator 116. Further, the target resonator 121 may receive various messages from the source device 110 through in-band communication.

The rectifier 122 may generate a DC voltage by rectifying an AC voltage. That is, the rectifier 122 may rectify an AC voltage provided to the target resonator 121 through wireless communication.

Specifically, referring to FIG. 14, the rectifier 122 according to the present embodiment may include a full-bridge diode rectifier circuit. In this full-bridge diode rectifier circuit, there are two diodes in one path. That is, the current flowing through one path passes through two diodes.

The rectifier 122 may receive a first output (RF+) and a second output (RF−) of the target resonator 121, and convert them into a third output (DC+). The first output (RF+) and the second output (RF−) may include differential signals output from the target resonator 121. The first output (RF+) and the second output (RF−) may include RF differential input signals. The first output (RF+) may include a signal having a positive (+) phase. The second output (RF−) may include a signal having a negative (−) phase.

The third output (DC+) may include a signal output from the rectifier 122 after the signal is rectified by the rectifier 122. In some embodiments of the present inventive concept, the third output (DC+) may include a DC voltage.

The rectifier 122 according to the present embodiment may include first to fourth Schottky diodes SD1 to SD4, and a capacitor Cr.

As shown in FIG. 14, the anode electrode of the first Schottky diode SD1 may be connected to an RF− connector, and the cathode electrode of the first Schottky diode SD1 may be connected to a DC+ connector. The anode electrode of the second Schottky diode SD2 may be connected to an RF+ connector, and the cathode electrode of the second Schottky diode SD2 may be connected to the DC+ connector. The anode electrode of the third Schottky diode SD3 may be connected to a ground, and the cathode electrode of the third Schottky diode SD3 may be connected to the RF− connector. The anode electrode of the fourth Schottky diode SD4 may be connected to the ground, and the cathode electrode of the fourth Schottky diode SD4 may be connected to the RF+ connector.

The capacitor Cr may be connected between the DC+ connector and the ground. That is, one terminal of the capacitor Cr may be connected to the DC+ connector, and the other terminal of the capacitor Cr may be connected to the ground.

The semiconductor devices 1 to 4 according to the above-described embodiments of the present inventive concept may be employed as first to fourth Schottky diodes SD1 to SD4. Accordingly, as described above, the insular impurity regions may be formed below the anode electrodes of the first to fourth Schottky diodes SD1 to SD4.

Referring again to FIG. 13, the DC/DC converter 123 may adjust the level of the DC voltage output from the rectifier 122 to correspond to the capacity of the charger 125. For example, the DC/DC converter 123 may adjust the level of the DC voltage output from the rectifier 122 to 3~10 Volts.

The switch unit 124 may be turned on/off under the control of the control unit 126. If the switch unit 124 is turned off, the control unit 115 of the source device 110 may detect a reflected wave. That is, if the switch unit 124 is turned off, the magnetic coupling between the source resonator 116 and the target resonator 121 may be removed.

In this embodiment, the charger 125 may include a battery. The charger 125 may charge the battery using the DC voltage output from the DC/DC converter 123.

The control unit 126 may establish an in-band communication to transmit/receive data using the resonant frequency. In this case, the control unit 126 may demodulate a received signal by detecting a signal between the target resonator 121 and the rectifier 122, or demodulate a received signal by detecting an output signal of the rectifier 122. In other words, the control unit 126 may demodulate the messages received through in-band communication.

Further, the control unit 126 may modulate a signal to be transmitted to the source device 110 by adjusting the impedance of the target resonator 121. Further, the control unit 126 may demodulate a signal to be transmitted to the source device 110 by turning on/off the switch unit 124. For example, the control unit 126 may increase the impedance of the target resonator 121 such that a reflected wave can be detected in the control unit 115 of the source device 110. The control unit 115 of the source device 110 may detect a binary number, i.e., "0" or "1", depending on whether the reflected wave is generated.

The control unit 126 may perform an out-of-band communication using a communication channel. The control unit 126 may include a communication module such as Zigbee™ and/or Bluetooth™. The control unit 126 may exchange data with the source device 110 through the out-of-band communication.

Figure 15:
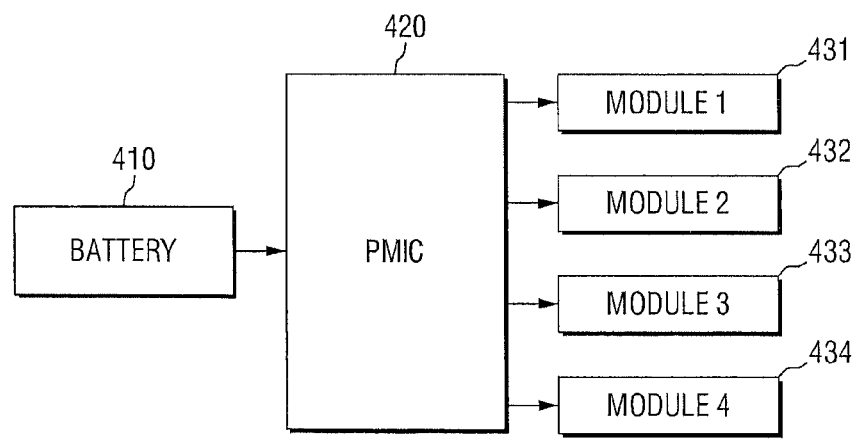
FIG. 15 is a block diagram of a semiconductor system according to another embodiment of the present inventive concept.

FIG. 15 is a block diagram of a semiconductor system according to another embodiment of the present inventive concept.

Referring to FIG. 15, the semiconductor system according to the present embodiment may include a battery 410, a power management IC (PMIC) 420 and a plurality of modules 431-434. The PMIC 420 converts a voltage provided from the battery 410 into a voltage having a level that is required for each of the modules 431 to 434, and provides the voltage to each of the modules 431 to 434. In this case, the PMIC 420 may include at least one of the semiconductor devices 1 to 4 according to the above-described embodiments of the present inventive concept.

Figure 16:
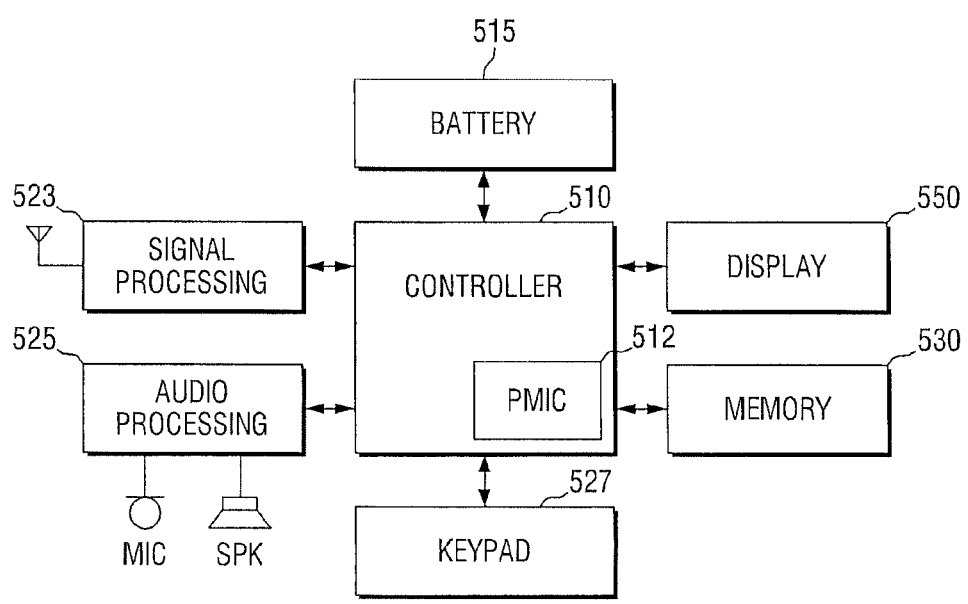
FIG. 16 is a block diagram of a semiconductor system according to still another embodiment of the present inventive concept.

FIG. 16 is a block diagram of a semiconductor system according to still another embodiment of the present inventive concept.

Referring to FIG. 16, the semiconductor system according to the present embodiment includes a controller 510, a PMIC 512, a battery 515, a signal processing unit 523, an audio processing unit 525, a memory unit 530, a display unit 550, and the like.

A keypad 527 may include keys for inputting numeric and text information and may further include function keys for setting various functions.

The signal processing unit 523 may perform a wireless communication function of a mobile terminal. In doing so, the signal processing unit 523 may include a RF unit and a modem. The RF unit may include a RF transmitter for frequency up-conversion and amplification of a transmitted signal, a RF receiver for low noise amplification and frequency down-conversion of a received signal, and the like. The modem may include a transmitter for coding and modulating a signal to be transmitted, a receiver for demodulating and decoding a signal to be received in the RF unit, and the like.

The audio processing unit 525 may include a codec. The codec may include a data codec and/or an audio codec. The data codec may process packet data and the like. The audio codec may process an audio signal such as a multimedia file and voice. Further, the audio processing unit 525 may convert a digital audio signal received from the modem into an analog audio signal through the audio codec, and reproduce the analog audio signal. Alternatively, or in addition, the audio processing unit 525 may convert an analog audio signal generated from a microphone into a digital audio signal through the audio codec, and transmit the digital audio signal to the modem. The codec may be provided separately, or be included in the controller 510 of the semiconductor system.

The memory unit 530 may include a read only memory (ROM) and a random access memory (RAM). The memory unit 530 include a program memory and data memories, and may store programs for controlling an operation of the mobile terminal and data for booting.

The display unit 550 may display a video signal and user data on a screen, or display data associated with calling. In this case, the display unit 550 may include a liquid crystal display (LCD) or organic light emitting diodes (OLEDs). In the case of implementing a LCD or OLEDs as a touch screen, the display unit 550 and the keypad 527 may be operated as an input unit to control the mobile terminal.

The controller 510 may serve to control the overall operation of the semiconductor system. The controller 510 may include the PMIC 512 as illustrated. The PMIC 512 may convert a voltage provided from the battery 515 into a voltage having a required level. Further, the PMIC 512 may rectify a signal such as an AC voltage provided from the outside into a DC voltage, and charge the battery 515 using the rectified DC voltage. In this case, the PMIC 512 may include at least one of the semiconductor devices 1 to 4 according to the above-described embodiments of the present inventive concept.

Figure 17:
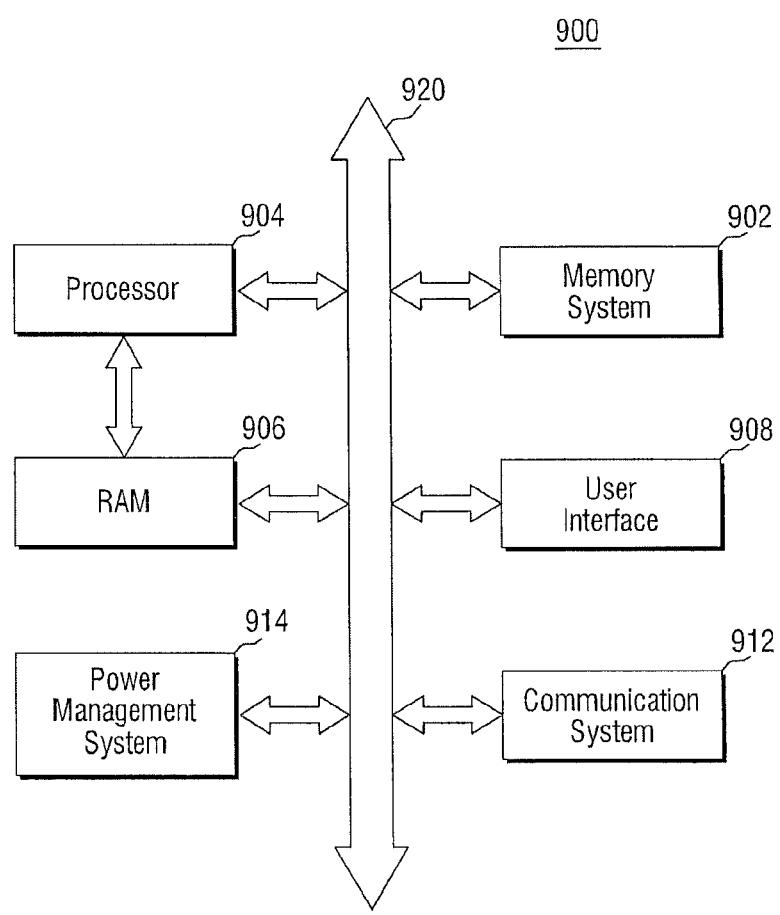
FIG. 17 is a block diagram showing a configuration of an exemplary electronic system in which a semiconductor system according to embodiments of the present inventive concept can be employed.

FIG. 17 is a block diagram showing a configuration of an exemplary electronic system 900 in which a semiconductor system according to the embodiments of the present inventive concept can be employed.

Referring to FIG. 17, the electronic system 900 may include a memory system 902, a processor 904, a RAM 906, a user interface 908, a communication system 912 and a power management system 914.

The memory system 902, the processor 904, the RAM 906, the user interface 908, the communication system 912 and the power management system 914 may perform a data communication with each other via a bus 920 or the like. In some embodiments of the present inventive concept, the bus 920 may be, for example, a multi-layer bus, but the present inventive concept is not limited thereto.

The processor 904 may be constructed and arranged to execute a program and control the electronic system 900. The processor 904 may include at least one of at least one microprocessor, a digital signal processor, a micro-controller and logic devices capable of performing functions similar to those thereof. In some embodiments of the present inventive concept, the processor 904 may include an operation cache such as L1 and L2 to improve an operating speed.

The RAM 906 may be used an operating memory of the processor 904. The RAM 906 may be formed of a volatile memory such as a DRAM.

Meanwhile, the processor 904 and the RAM 906 may be implemented to be packaged in one semiconductor device or semiconductor package. In some embodiments of the present inventive concept, the processor 904 and the RAM 906 may be implemented to be packaged in the form of Package on Package (PoP), but the present inventive concept is not limited thereto.

The user interface 908 may be used to exchange data with the electronic system 900. As examples of the user interface 908, there are a keypad, a keyboard, a touch sensor, a display device and the like. The user interface 908 may be implemented as an independent system in the electronic system 900. For example, the keypad, the keyboard, the touch sensor, and/or the like may be implemented as an input system, and the display device may be implemented as a display system. The display system may include a data driving IC (DDIC) for driving the display device and the like.

The memory system 902 may include at least one non-volatile memory device for storing codes for the operation of the processor 904, data processed by the processor 904, and/or data input from the outside. The memory system 902 may include a separate controller for driving.

The controller may be configured to connect the host to the non-volatile memory device. In response to a request from the host, the controller may access the non-volatile memory device. For example, the controller may be configured to control read, write, erase and background operations of the non-volatile memory device.

The controller may be configured to provide an interface between the non-volatile memory device and the host. Further, the controller may be configured to drive firmware for controlling the non-volatile memory device.

As an example, the controller may further include well-known components such as a random access memory (RAM), a processing unit, a host interface and a memory interface. The RAM may be used as at least one of an operating memory of the processing unit, a cache memory between the host and the non-volatile memory device, and a buffer memory between the host and the non-volatile memory device. The processing unit may control the overall operation of the controller.

The host interface may include a protocol for performing data exchange between the host and the controller. The controller may be configured to communicate with an external device (host) through at least one of various interface protocols, e.g., a universal serial bus (USB) protocol, multimedia card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol. The memory interface may interface with the non-volatile memory device. For example, the memory interface may include a NAND interface or NOR interface.

The memory system 902 may be configured to include an error correction block. The error correction block may be configured to detect and correct a data error or the like at the memory system 902 using an error correction code (ECC). For example, the error correction block may be provided as a component of the above-described controller. However, the present inventive concept is not limited thereto, and the error correction block may be provided as a component of the non-volatile memory device.

In an information processing system such as a mobile device and desktop computer, a flash memory or other non-volatile memory device may be constructed and arranged as the memory system 902. This flash memory may be configured as a solid state drive (SSD). In this case, the electronic system 900 may reliably store a large capacity of data in the flash memory or other memory device.

The memory system 902 may be integrated into a single semiconductor device. For example, the memory system 902 may be integrated into a single semiconductor device to form a memory card. As examples of the memory card, a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS) may be mentioned.

The memory system 902 may be mounted as various types of packages. For example, the memory system 902 may be mounted as a package such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), and wafer-level processed stack package (WSP).

The communication system 912 may process a communication between the electronic system 900 and an external device. The power management system 914 may manage power in the electronic system 900. In the power management system 914, the semiconductor system according to the above-described embodiments of the present inventive concept may be employed.

The electronic system 900 shown in FIG. 17 may be applied to an electronic control unit of a variety of electronic devices.

Figure 18:
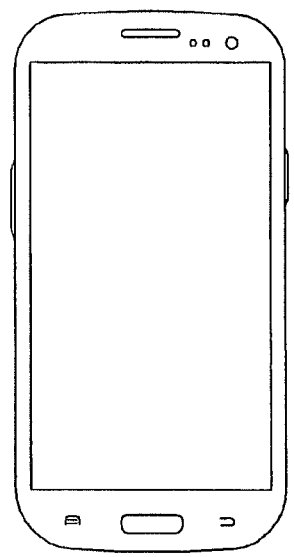
FIG. 18 is a diagram illustrating an example in which the electronic system of FIG. 17 is applied to a smart phone.

FIG. 18 is a diagram illustrating an example in which the electronic system 900 of FIG. 17 can be applied to a smart phone 1000 or related electronic device. In this case, a part of the electronic system shown in FIG. 13 or the electronic system 900 of FIG. 17 may be constructed and arranged as an application processor (AP) implemented in the form of System On Chip (SoC).

Figure 19:
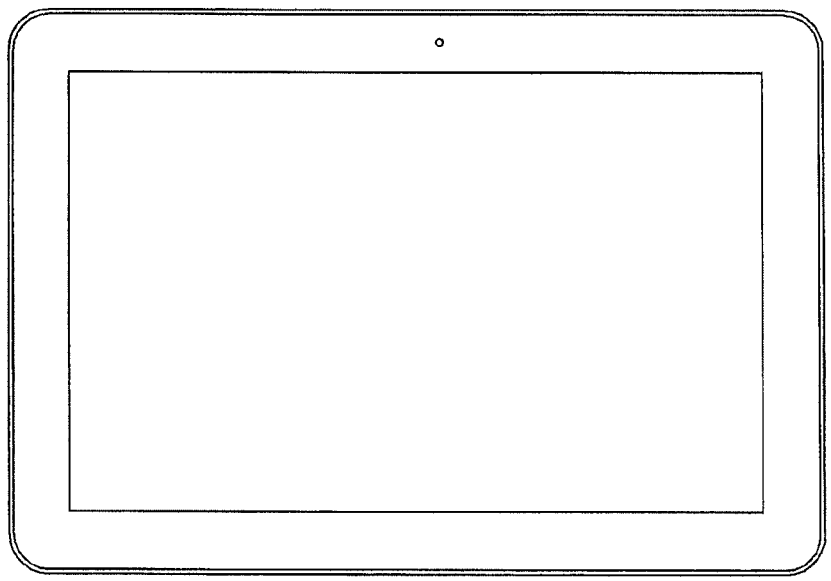
FIG. 19 shows an example in which the electronic system of FIG. 17 is applied to a tablet PC.
Figure 20:
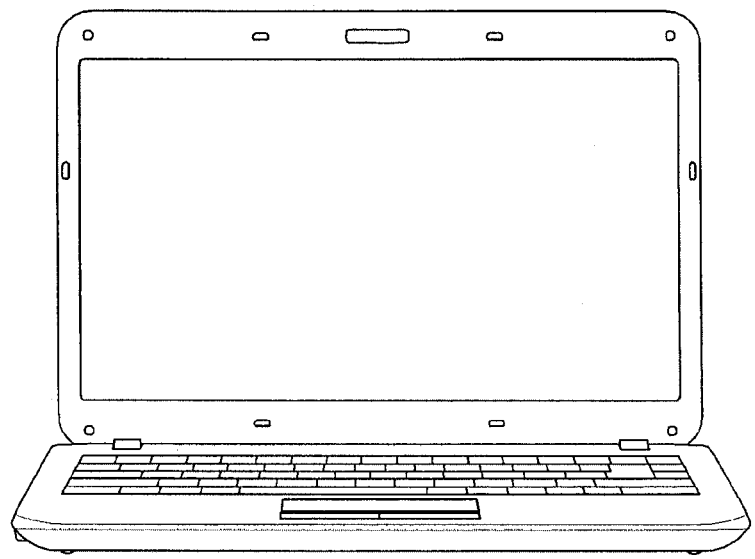
FIG. 20 shows an example in which the electronic system of FIG. 17 is applied to a laptop.

The electronic system 900 (see FIG. 17) may be employed in other electronic devices. For example, as shown in FIG. 19, the electronic system 900 of FIG. 17 can be applied to a tablet PC 1100. FIG. 20 shows an example in which the electronic system 900 of FIG. 17 is applied to a laptop 1200.

The electronic system 900 (see FIG. 17) may be provided as one of various components of an electronic device such as a computer, a ultra mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and/or one of various components constituting a computing system.

In the case where the electronic system 900, for example, described with reference to FIG. 17, is an apparatus which can perform wireless communication, the electronic system 900 of FIG. 17 may be used in a communication system such as Code Division Multiple Access (CDMA), Global System for Mobile communication (GSM), North American Digital Cellular (NADC), Enhanced-Time Division Multiple Access (E-TDMA), Wideband Code Division Multiple Access (WCDAM), and/or CDMA2000 network.

FIGS. 21 to 24 are diagrams showing intermediate steps of a method for fabricating a semiconductor device according to an embodiment of the present inventive concept.

Figure 21:
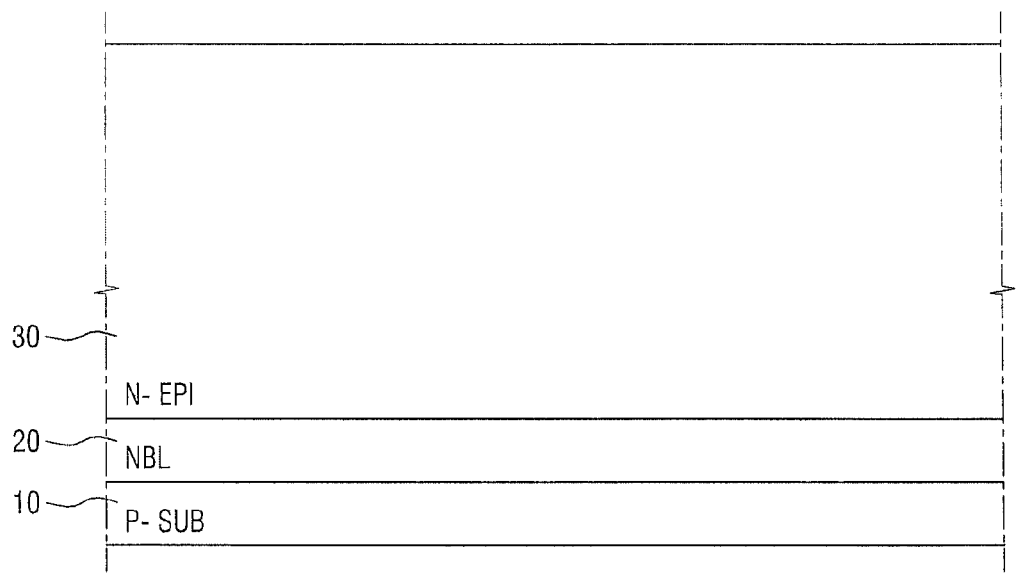
FIGS. 21 to 24 are diagrams showing intermediate steps of a method for fabricating a semiconductor device according to an embodiment of the present inventive concept.

First, referring to FIG. 21, the buried layer (NBL) 20 and the epitaxial layer (N-EPI) 30 are sequentially formed on a substrate (P-SUB) 10.

The substrate 10 may include a semiconductor material. The substrate 10 may be made of at least one semiconductor material selected from the group consisting of, for example, Si, Ge, SiGe, GaP, GaAs, SiC, SiGeC, InAs and InP. In the present embodiment, a conductive type of the substrate 10 may be, for example, a P type (P-SUB) substrate.

In some embodiments of the present inventive concept, the buried layer 20 may be formed at a boundary between the substrate 10 and the epitaxial layer 30. More specifically, a portion of the buried layer 20 is formed on the substrate 10 and the remaining portion of the buried layer 20 is formed on the epitaxial layer 30. In doing so, after the buried layer 20 is formed in the substrate 10 and the epitaxial layer 30 is formed on the substrate 10, heat treatment may be performed. When the heat treatment is in progress, since the buried layer 20 is diffused into the substrate 10 and the epitaxial layer 30, a portion of the buried layer 20 may be formed on the substrate 10 and the remaining portion of the buried layer 20 may be formed on the epitaxial layer 30. In this embodiment, a conductive type of the buried layer 20 may be, for example, an N type. Further, in this embodiment, a conductive type of the epitaxial layer 30 may be, for example, an N type. In this case, the concentration of N-type impurities contained in the epitaxial layer 30 may be lower than the concentration of N-type impurities contained in the buried layer 20. Further, in some embodiments of the present inventive concept, the buried layer 20 may be omitted.

Figure 22:
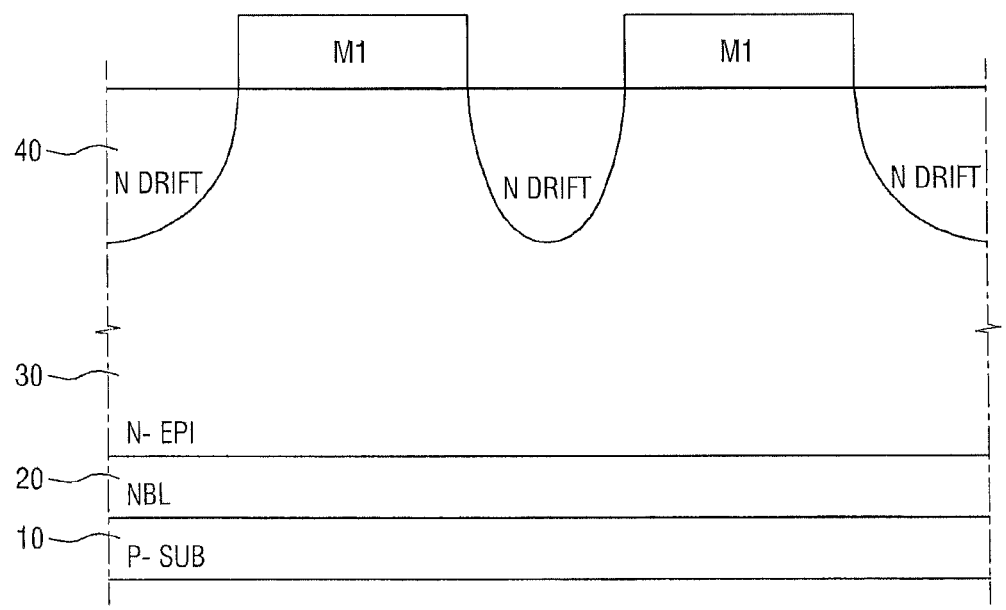

Referring again to the method, at FIG. 22, a first mask M1 is formed on the epitaxial layer 30. Then, a plurality of first drift layers 40 are formed in the epitaxial layer 30 using the first mask M1. In this case, each of the first drift layers (N DRIFT) 40 may be formed as an insular impurity region. In other words, each of the first drift layers 40 may be formed such that a maximum cross-sectional diameter is equal to or less than 5 μm, and the impurity concentration in the region is 10 times to 1,000 times the impurity concentration of the epitaxial layer 30.

In this embodiment, a conductive type of the first drift layers 40 may be, for example, an N type. Further, the concentration of N-type impurities contained in the first drift layers 40 may be, for example, 1e15 to 1e18 atoms/cm$^2$, but the present inventive concept is not limited thereto.

Figure 23:
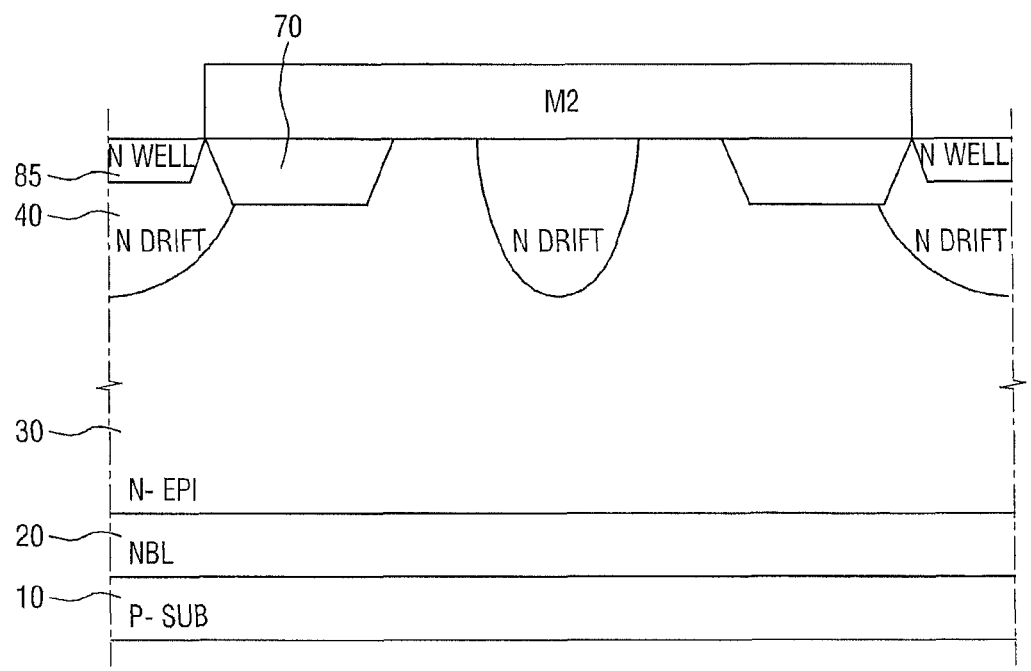

Referring to FIG. 23, the element isolation film 70 is formed in the epitaxial layer 30. Subsequently, a second mask M2 is formed on the epitaxial layer 30. Then, the second wells 85 are formed in the first drift layers 40 using the second mask M2. In this embodiment, a conductive type of the second wells 85 may be, for example, an N type.

Figure 24:
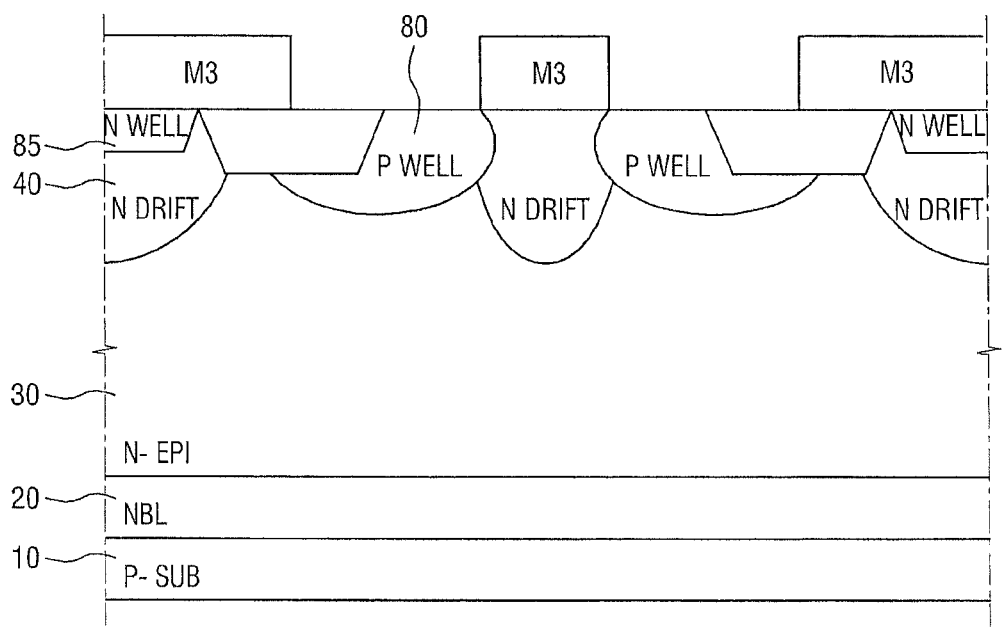

Referring to FIG. 24, a third mask M3 is formed on the epitaxial layer 30. Subsequently, first wells 80 are formed in the epitaxial layer 30 using the third mask M3.

In this embodiment, a conductive type of the first wells 80 may be, for example, a P type. Accordingly, the first wells 80 and the epitaxial layer 30 may form a PN junction. Meanwhile, the concentration of impurities contained in the first wells 80 may be higher than the concentration of impurities contained in the substrate 10.

As illustrated, the first wells 80 may be arranged to be separated from each other by the first drift layers 40. Further, the first wells 80 may overlap the first drift layers 40 as illustrated. Meanwhile, the first wells 80 also may overlap an element isolation film 70 as illustrated. Further, the first wells 80 may be formed to be thinner than the first drift layers 40. Specifically, as illustrated, the first wells 80 may be formed such that the depth of the lower surfaces of the first wells 80 is smaller than the depth of the lower surfaces of the first drift layers 40.

Then, the semiconductor device 1 shown in FIG. 2 may be fabricated by forming the third wells 75 (see for example FIG. 2) in the first wells 80, forming a cathode electrode 54 (see FIG. 2) on the second wells 85 to be in contact with the second wells 85, and forming an anode electrode 52 (see for example FIG. 2) on the first drift layers 40 formed between the first wells 80 to be in contact with the third wells 75 (see for example FIG. 2).

If the arrangement of the cathode electrode 54 and the anode electrode 52, for example, illustrated at FIG. 2 is formed in a different way, the semiconductor device 2 shown in FIGS. 6 and 7 may be fabricated.

Figure 25:
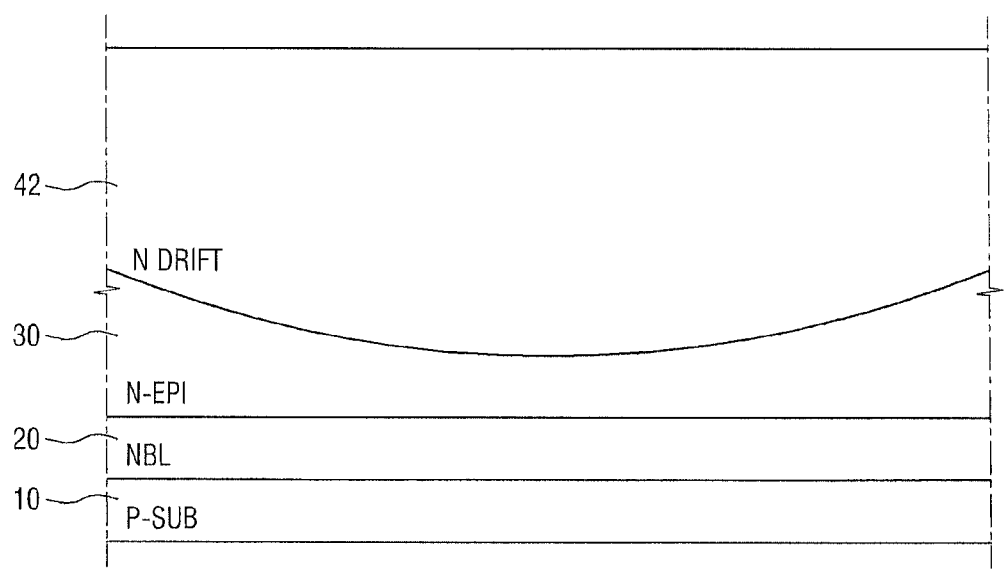
FIGS. 25 to 27 are diagrams showing intermediate steps for explaining a method for fabricating a semiconductor device according to another embodiment of the present inventive concept.
Figure 26:
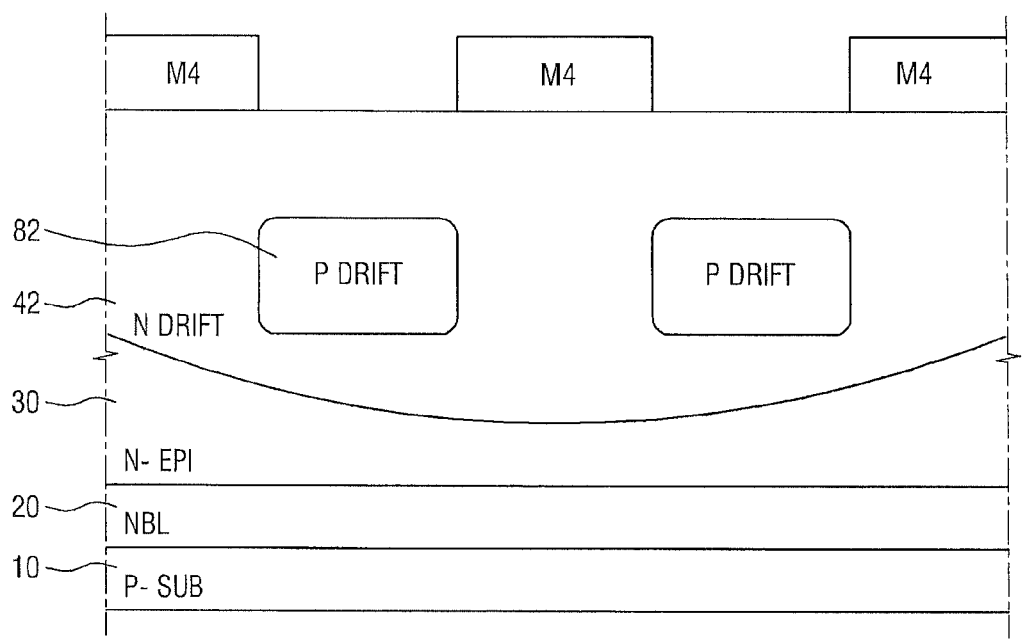
Figure 27:
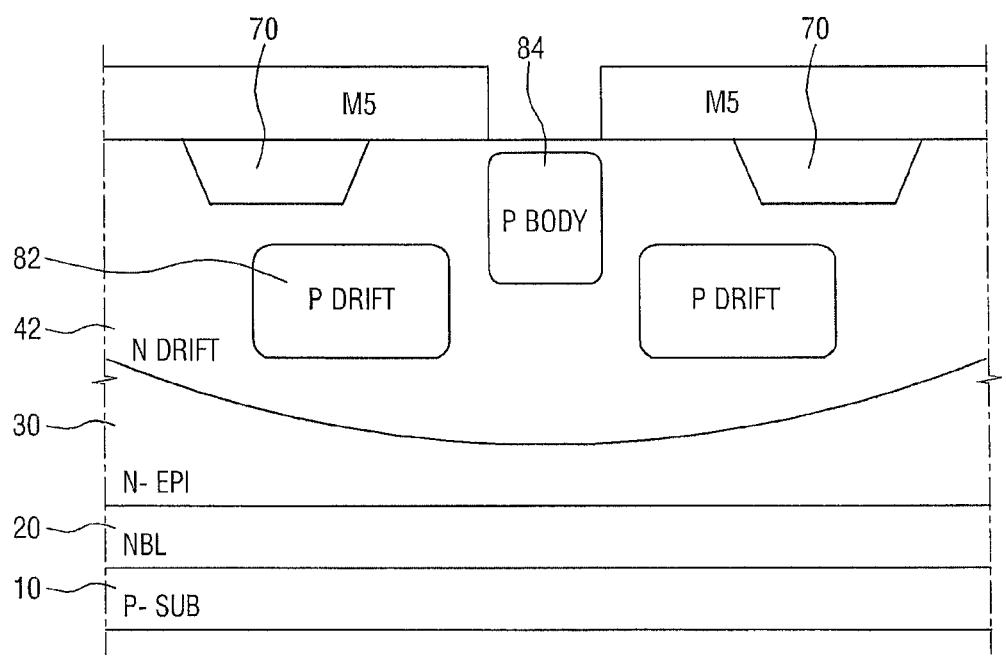

FIGS. 25 to 27 are diagrams showing intermediate steps for explaining a method for fabricating a semiconductor device according to another embodiment of the present inventive concept. The following description will be given focusing on differences from the above-described embodiment.

Referring to FIG. 25, a buried layer 20, an epitaxial layer 30 and a first drift layer 42 are sequentially formed on a substrate 10.

In this embodiment, the first drift layer 42 may be formed on the entire surface of the epitaxial layer 30 rather than being formed in the form of an insular impurity region as in the above-described embodiment.

Referring to FIG. 26, a fourth mask M4 is formed on the first drift layer 42. Subsequently, second drift layers 82 are formed in the first drift layer 42 using the fourth mask M4.

A conductive type of the second drift layers 82 may be, for example, a P type. Further, as illustrated, the first drift layer 42 may surround the second drift layers 82. Accordingly, the second drift layers 82 and the first drift layer 42 may form a PN junction.

The concentration of impurities contained in the second drift layers 82 may be higher than the concentration of impurities contained in the substrate 10. Specifically, the concentration of P-type impurities contained in the second drift layers 82 may be, for example, 1e14 to 1e18 atoms/cm$^2$, but the present inventive concept is not limited thereto.

Then, referring to FIG. 27, the element isolation film 70 is formed in the first drift layer 42. Subsequently, a fifth mask M5 is formed on the first drift layer 42. The body region 84 is formed in the first drift layer 42 using the fifth mask M5.

The body region 84 may be formed between the second drift layers 82 as illustrated. Further, the body region 84 may be formed to be thinner than the second drift layers 82. Specifically, the body region 84 may be formed such that the depth of the lower surface of the body region 84 is smaller than the depth of the lower surfaces of the second drift layers 82.

In this embodiment, the body region 84 may be formed in the form of an insular impurity region. In other words, the body region 84 may be formed such that a maximum cross-sectional diameter is equal to or less than 5 μm, and the impurity concentration in the region is 10 times to 1,000 times the impurity concentration of the first drift layer 42.

A conductive type of the body region 84 may be, for example, a P type. Further, the concentration of P-type impurities contained in the body region 84 may be higher than the concentration of P-type impurities contained in the second drift layers 82. Specifically, the concentration of P-type impurities contained in the body region 84 may be, for example, 1e16 to 1e20 atoms/cm$^2$, but the present inventive concept is not limited thereto.

Then, the semiconductor device 3 shown in FIG. 10 may be fabricated by forming the second wells 85 (see for example, FIG. 10) and the third wells 75 (see for example FIG. 10) in the first drift layer 42, forming a cathode electrode 54 (see for example FIG. 10) on the second wells 85 (see FIG. 10) to be in contact with the second wells 85 (see for example, FIG. 10), and forming an anode electrode 52 (see for example FIG. 10) on the body region 84 to be in contact with the third wells 75

The semiconductor device 4 shown in FIG. 12 may be fabricated by omitting the formation of the body region 84 and forming the second drift layers 82 as a plurality of insular impurity regions.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device comprising:
   an epitaxial layer of a first conductive type;
   an anode electrode and a cathode electrode on the epitaxial layer;
   a first drift layer of the first conductive type at the epitaxial layer;
   a Schottky contact area at a region of contact between the anode electrode and the first drift layer;
   an impurity region of a second conductive type different from the first conductive type at the epitaxial layer; and
   an insular impurity region formed below the Schottky contact area and the below the anode electrode, the insular impurity region directly adjacent the impurity region,
   wherein a conductive type of the insular impurity region is the same as the first conductive type, and
   wherein the cathode electrode comprises first and second cathode electrodes,
   the first cathode electrode has a dot shape,
   the anode electrode is constructed and arranged to surround the first cathode electrode, and
   the second cathode electrode is constructed and arranged to surround the anode electrode.

2. The semiconductor device of claim 1, wherein the insular impurity region includes a region having a maximum cross-sectional diameter that is equal to or less than 5 μm, and having an impurity concentration that is 10 times to 1,000 times an impurity concentration of the epitaxial layer.

3. The semiconductor device of claim 1, wherein the semiconductor device comprises a Schottky diode.

4. The semiconductor device of claim 1, wherein the first drift layer comprises a plurality of insular impurity regions separated from each other, and wherein one of the plurality of insular impurity regions includes the insular impurity region below the Schottky contact area.

5. The semiconductor device of claim 4, wherein the impurity region of the second conductive type comprises wells of the second conductive type arranged on both sides of the insular impurity region.

6. The semiconductor device of claim 1, wherein the anode electrode and the cathode electrode are arranged in a grid shape.

7. The semiconductor device of claim 1, wherein a conductive type of the insular impurity region is the same as the second conductive type.

8. The semiconductor device of claim 7, wherein the first drift layer is constructed and arranged to surround the insular impurity region.

9. The semiconductor device of claim 7, wherein the impurity region of the second conductive type comprises a second drift layer of the second conductive type at the first drift layer.

10. The semiconductor device of claim 9, wherein the second drift layer and the insular impurity region are constructed and arranged to be separated from each other.

11. The semiconductor device of claim 9, wherein an impurity concentration of the insular impurity region is higher than an impurity concentration of the second drift layer.

12. The semiconductor device of claim 7, wherein the impurity region of the second conductive type comprises a plurality of second drift layers of the second conductive type at the first drift layer, and wherein the insular impurity region is one of the plurality of second drift layers.

13. The semiconductor device of claim 1, wherein the first conductive type includes an N type conductivity type and the second conductive type includes a P type conductivity type.

14. The semiconductor device of claim 1, further comprising:
 a semiconductor substrate of the second conductive type; and
 a buried layer of the first conductive type formed on the semiconductor substrate,
 wherein the epitaxial layer is formed on the buried layer.

15. A semiconductor device comprising:
 an epitaxial layer of a first conductive type;
 an anode electrode and a cathode electrode on the epitaxial layer, wherein the cathode electrode comprises first and second cathode electrodes, the first cathode electrode has a dot shape, the anode electrode is constructed and arranged to surround the first cathode electrode, and the second cathode electrode is constructed and arranged to surround the anode electrode;
 a first drift layer of the first conductive type at the epitaxial layer;
 a Schottky contact area at a region of contact between the anode electrode and the first drift layer;
 an impurity region of a second conductive type different from the first conductive type at the epitaxial layer; and
 an insular impurity region formed below the Schottky contact area, wherein a conductive type of the insular impurity region is the same as the first conductive type.

* * * * *